United States Patent [19]
Tsubaki et al.

[11] Patent Number: 5,892,402
[45] Date of Patent: Apr. 6, 1999

[54] HIGH PRECISION CURRENT OUTPUT CIRCUIT

[75] Inventors: Kazunari Tsubaki; Norio Ueno, both of Kawasaki, Japan

[73] Assignee: Fujitsu Limited, Kawasaki, Japan

[21] Appl. No.: 741,748

[22] Filed: Nov. 5, 1996

[30] Foreign Application Priority Data

Nov. 17, 1995 [JP] Japan ..................... 7-300279

[51] Int. Cl.[6] ............... H23F 3/16; G05F 3/16
[52] U.S. Cl. ........................... 332/288; 323/315
[58] Field of Search ............ 330/288; 323/315, 323/316; 327/490, 543

[56] References Cited

U.S. PATENT DOCUMENTS

| | | |
|---|---|---|
| 4,477,782 | 10/1984 | Swanson . |
| 4,651,083 | 3/1987 | Lachmann et al. . |
| 5,319,303 | 6/1994 | Yamada . |
| 5,545,972 | 8/1996 | Kiehl .................................. 323/316 X |
| 5,598,094 | 1/1997 | Kiehl .................................. 323/316 X |

OTHER PUBLICATIONS

JP Abstract, No. 6–104762 (Apr. 1994).
JP Abstract, No. 62–276908 (Dec. 1987).

*Primary Examiner*—James B. Mullins
*Attorney, Agent, or Firm*—Staas & Halsey

[57] ABSTRACT

A drain terminal of a first N-channel MOS transistor is connected to an output side of a first current mirror input current via a voltage drop device, a first current mirror input current is supplied to the gate terminals of first, third, and fifth N-channel MOS transistors, and a second current mirror input current is supplied to the gate terminals of second and fourth N-channel MOS transistors.

24 Claims, 16 Drawing Sheets

OUTPUT TERMINAL VOLTAGE -
OUTPUT TERMINAL CURRENT
CHARACTERISTICS

HIGH PRECISION CURRENT OUTPUT CIRCUIT

FIELD OF THE INVENTION

1. Background of the Invention

The present invention relates to a high precision current output circuit, such as a current amplification circuit, a reference current generation circuit, a voltage/current conversion circuit, etc., and to a method for generating a reference current. The current output circuit according to the present invention is preferably applied to a case where a current mirror circuit operates at a low input/output voltage.

2. Related Art of the Invention

As a current amplification circuit for supplying an output current in proportion to an input current, a current mirror circuit has been used. If a high precision current is needed, the current mirror circuit in a cascade form has been employed to obtain a high output resistance.

An explanation of a conventional cascade current mirror circuit is provided hereinafter, by referring to the drawings.

FIG. 1 is a circuit diagram showing a structure of a conventional cascade current mirror circuit.

In this figure, M100 through M103 indicate N-channel MOS transistors. The N-channel MOS transistors M100 and M102 configure a current mirror circuit of a first stage, while the N-channel MOS transistors M101 and M103 configure a current mirror circuit of a second stage. The current mirror circuit of the first stage and the current mirror circuit of the second stage are connected in tandem.

By inputting a reference current Iref to a drain of the N-channel MOS transistor M100, an output current Io is output to a drain of the N-channel MOS transistor M102. In this case, the value of the gate voltage of the N-channel MOS transistor M103 is Vth+α, and the value of the gate voltage of the N-channel MOS transistor M102 is 2(Vth+α).

Vth is the value of a threshold voltage of the N-channel MOS transistors M100 through M103, and α is a value obtained by subtracting the value of threshold voltage Vth from a voltage between the gate and the source, VGS, of the N-channel MOS transistors M100 through M103 (on the condition that a drain current "ID" is equal to the input reference current Iref).

FIG. 2 shows the relationship between an output voltage Vo and the output current Io. If the value of the output voltage Vo is equal to or less than 2α, the N-channel MOS transistors M102 and M103 operate in a non-saturation region (triode region). If the value of the output voltage Vo is between 2α and Vth+2α, the N-channel MOS transistor M102 operates in a non-saturation region, and the N-channel MOS transistor M103 operates in a saturation region (pinch-off region). If the value of the output voltage Vo is equal to or greater than Vth+2α, the N-channel MOS transistors M102 and M103 operate in the saturation region.

That is, if the value of the output voltage Vo is equal to or greater than Vth+2α, the slope of the Vo–Io curve is very small, so that an output resistance can be significantly increased in order to obtain a high precision output current Io.

Provided next is an explanation of a conventional compound current mirror circuit, by referring to the drawings.

FIG. 3 is a circuit diagram showing a structure of the conventional compound current mirror circuit.

In this figure, M110 through M114 indicate N-channel MOS transistors. A proportion "W/L" of gate length to gate width of the N-channel MOS transistor M110 is one fourth of a proportion "W/L" of gate length to gate width of the N-channel MOS transistors M111 through M114.

A drain terminal of the N-channel MOS transistor M110 is connected to an output side of a first input current I1, and a gate terminal of the N-channel MOS transistor M110 is connected to the drain terminal of the N-channel MOS transistor M110. A source terminal of the N-channel MOS transistor M110 is connected to a ground GND.

A drain terminal of the N-channel MOS transistor M111 is connected to an output side of a second input current I2, and a gate terminal of the N-channel MOS transistor M111 is connected to the gate terminal of the N-channel MOS transistor M110.

A drain terminal of the N-channel MOS transistor M112 is connected to a source terminal of the N-channel MOS transistor M111, and a gate terminal of the N-channel MOS transistor M112 is also connected to the output side of the second input current I2. A source terminal of the N-channel MOS transistor M112 is connected to the ground GND.

A drain terminal of the N-channel MOS transistor M113 is connected to an output terminal, and a gate terminal of the N-channel MOS transistor M113 is connected to the gate terminal of the N-channel MOS transistor M111.

A drain terminal of the N-channel MOS transistor M114 is connected to a source terminal of the N-channel MOS transistor M113. A gate terminal of the N-channel MOS transistor M114 is also connected to the output side of the second input current I2, and a source terminal of the N-channel MOS transistor M114 is connected to the ground GND.

By supplying the input currents I1 and I2 to the drains of the N-channel MOS transistors M110 and M111 respectively, the output current Io is output to the drain of the N-channel MOS transistor M113.

In this case, a voltage VGS' between the gate and the source of the N-channel MOS transistor M110 is Vth+2α according to the following calculation.

Assume that the voltage between the gate and the source of the N-channel MOS transistors M111 through M114 is VGS, and the proportion W/L of gate length to gate width of the N-channel MOS transistor M110 is one fourth of the proportion W/L of gate length to gate width of the N-channel MOS transistors M111 through M114. Therefore:

$$K \cdot \tfrac{1}{4} \cdot W/L \, (VGS'-Vth)^2 = K \cdot W/L \, (VGS-Vth)^2$$

is obtained. Accordingly, $$(VGS'-Vth)^2 = 4(VGS-Vth)^2$$

As a result, $$VGS' = Vth + 2(VGS-Vth) = Vth + 2\alpha$$

In the above described equations, K is a constant, and Vth is a threshold voltage of the N-channel MOS transistors M110 through M114.

As a result, the gate voltage of the N-channel MOS transistors M111 and M113 is in Vth+2α.

Since the gate voltage of the N-channel MOS transistors M112 and M114 is Vth+α, the N-channel MOS transistors M113 and M114 operate in a saturation region when the value of the output voltage Vo is equal to or greater than 2α as shown in FIG. 4.

In addition, the voltage on the input current I1 side which requires a higher voltage at an input terminal, is in Vth+2α.

Accordingly, input and output voltages required for operating in a high-resistance region become lower than those of the cascade current mirror circuit shown in FIG. 1, by the value of the threshold voltage.

To obtain a high precision current using a conventional cascade current mirror circuit, the circuit must operate at the input voltage equal to or higher than 2(Vth+α), and at the output voltage Vo equal to or higher than Vth+2α. Since the range of the voltages where a high precision current can be obtained is narrow, the conventional cascade current mirror circuit is sometimes unavailable in a low voltage power supply circuit.

To return a current, for example, by connecting an output of the N-channel cascade current mirror circuit and an input of a P-channel cascade current mirror circuit, a voltage whose value is equal to or greater than $2(Vth_N+\alpha_N)+(Vth_P+2\alpha_P)$ is required.

If $Vth_N=Vth_P=1V$, $\alpha_N=\alpha_P=0.1V$, the conventional circuit cannot be used at a power supply voltage of 3.3V.

In the above described equations, $Vth_N$ is a threshold voltage of an N-channel MOS transistor, and $Vth_P$ is a threshold voltage of a P-channel MOS transistor. $\alpha_N$ is a value obtained by subtracting the threshold voltage $Vth_N$ from a voltage VGS between a gate and a source of the N-channel MOS transistor (on the condition that the drain current ID is equal to the input current Iref). $\alpha_P$ is a value obtained by subtracting the threshold value $Vth_P$ from the voltage VGS between the gate and the source of the P-channel MOS transistor (on the condition that the drain current ID is equal to the input current Iref).

The conventional compound current mirror circuit operates at a voltage lower than that of a cascade current mirror circuit, but two input currents I1 and I2 are required. Specifically, to generate an initial reference current in an IC, how to generate these two input currents I1 and I2 is a problem.

If back gates of the N-channel MOS transistors M111 and M113 included in the compound current mirror circuit are connected to a ground GND, the threshold voltage of the N-channel MOS transistors M111 and M113 is higher than that of the N-channel MOS transistors M110, M112, and M114. An electric potential of a drain of the N-channel MOS transistor M112 becomes lower than the voltage a and cannot operate in a saturation region, in this case, so that a relative precision of the input and output currents is significantly degraded.

SUMMARY OF THE INVENTION

A first object of the present invention is to provide a current amplification circuit that can operate with high precision at low input/output voltages.

A second object of the present invention is to provide a reference current generation circuit which can generate a plurality of currents with high precision, a voltage/current conversion circuit, and a method for generating a reference current.

According to a feature of the present invention, a drain of a first input transistor is connected to a first current input terminal via a voltage drop means, and its gate is connected to the first current input terminal. A drain and a gate of a second input transistor are connected to a second current input terminal. A drain of a third input transistor is connected to a source of the second input transistor, and its gate is connected to the first current input terminal. A drain of a first output transistor is connected to an output terminal, and its gate is connected to the second current input terminal. A drain of a second output transistor is connected to a source of the first output transistor, and its gate is connected to the first current input terminal. As a result, an electric potential of the drain of the second output transistor can be lowered by a voltage drop produced by the voltage drop means, thereby lowering an output voltage.

According to another feature of the present invention, a drop voltage produced by the voltage drop means is set to a threshold voltage of the first input transistor or lower. As a result, an output voltage can be lowered by the voltage drop produced by the voltage drop means in a state where a precision of an output current is left unchanged.

According to a further feature of the present invention, a ratio between a current value from the first current input terminal and a proportion of gate length to gate width of the first input transistor, is set to a ratio equal to that between a current value from the second current input terminal and a proportion of gate length to gate width of the third input transistor. Furthermore, the ratio between the proportion of gate length to gate width of the third input transistor and the proportion of gate length to gate width of the second output transistor, is set to be equal to the ratio between the proportion of gate length to gate width of the second input transistor and the proportion of gate length to gate width of the first output transistor. As a result, each of the transistors can operate in the saturation region, thereby obtaining a high precision output current.

According to an additional feature of the present invention, the voltage drop means is a MOS transistor. Therefore, the voltage drop produced by the voltage drop means can be set arbitrarily.

According to an additional feature of the present invention, the voltage drop means is a resistance element. Therefore, the voltage drop produced by the voltage drop means can be set arbitrarily.

According to an additional feature of the present invention, the voltage drop means is a diode. Therefore, the voltage drop produced by the voltage drop means can be set with high precision.

According to a still further feature of the present invention, a MOS transistor whose drain terminal is connected to an output side of the first input current via a voltage drop device and whose gate terminal is connected to the output side of the first input current, a current mirror circuit of the second stage to which the first input current is input as a current mirror input, and a current mirror circuit of a second stage connected to the current mirror circuit of the first stage in tandem, to which a second input current is input as a current mirror input, are included. As a result, an output voltage of the current mirror circuit of the first stage can be lowered by a voltage drop produced by the voltage drop means, thereby lowering the output voltage of the current mirror circuit of the second stage.

According to a still further feature of the present invention, an input current is externally input to the first current input terminal of the first current amplification circuit. A current output terminal of the second current amplification circuit is connected to the second current input terminal of the first current amplification circuit.

Furthermore, the first current output terminal of the first current amplification circuit is connected to the first current input terminal of the second current amplification circuit. The second current output terminal of the first current amplification circuit is connected to the second current input terminal of the second current amplification circuit. An output current is output from the third current output terminal of the first current amplification circuit. As a result, supplying only one external input current allows a current amplification circuit which requires two current inputs to output a plurality of output currents.

According to a still further feature of the present invention, a current amplification circuit as recited above is used as the first and the second amplification circuits. Accordingly, externally inputting only one input current allows a current amplification circuit which requires two current inputs to output a plurality of high precision output currents at a low output voltage.

According to a still further feature of the present invention, a compound current mirror circuit is used as the first and the second current amplification circuits. Accordingly, externally inputting only one input current allows a current amplification circuit which requires two current inputs to output a plurality of high precision output currents at a low output voltage.

According to a still further feature of the present invention, an output current from a voltage/current conversion circuit to which a reference voltage is input, is used as an input current of the first current input terminal of a current amplification circuit as recited above or a compound current mirror circuit. Accordingly, externally inputting only one reference voltage allows a current amplification circuit which requires two current inputs to output a plurality of high precision output currents at a low output voltage.

According to a still further feature of the present invention, a P-channel field-effect transistor is used for the first current amplification circuit, and an N-channel field-effect transistor is used for the second current amplification circuit. As a result, externally inputting only one input current allows a current amplification circuit which requires two current inputs to output a plurality of output currents at a low output voltage.

According to a still further feature of the present invention, an N-channel field-effect transistor is used for the first current amplification circuit, and a P-channel field-effect transistor is used for the second current amplification circuit. As a result, externally inputting only one input current allows a current amplification circuit which requires two current inputs to output a plurality of output currents at a low output voltage.

According to a still further feature of the present invention, the result of a comparison between a voltage of a source and a reference voltage is input to a gate of the first transistor, the reference voltage is input to a source of the second transistor via a voltage follower, and the result of the comparison is input to its gate. As a result, supplying only one reference voltage allows output of a plurality of high precision reference currents.

According to a still further feature of the present invention, the first reference current generated by inputting the result of the comparison between the voltage of the source of the first transistor and the reference voltage to the gate of the first transistor, is supplied to the first current input terminal of the current amplification circuit, as recited above, the reference voltage is input to the source of the second transistor via a voltage follower, and the second reference current generated by inputting the result of the comparison to the gate of the second transistor, is supplied to the second current input terminal of the current amplification circuit as recited above. As a result, supplying only one reference voltage allows output of a plurality of high precision reference currents at a low output voltage.

According to a still further feature of the present invention, the first reference current generated by inputting to the source of the second transistor the result of the comparison between the voltage of the source of the first transistor and the reference voltage is supplied to the second current input terminal of the compound current mirror circuit, the reference voltage is input to the source of the second transistor via a voltage follower, and the second reference current generated by inputting the result of the comparison to the gate of the second transistor is supplied to the second current input terminal of the compound current mirror circuit. As a result, supplying only one reference voltage allows output of a plurality of high precision reference currents at a low output voltage.

According to a still further feature of the present invention, the source of the first transistor is connected to a voltage input terminal via a resistance element, its gate is connected to an output terminal of a first operational amplifier to which a reference voltage is supplied in a non-inverting input and the voltage of the source is supplied in an inverting input, a source of the second transistor is connected to an output terminal of a second operational amplifier to which the reference voltage is supplied in a non-inverting input and an output voltage is supplied in an inverting input, and its gate is connected to the output terminal of the first operational amplifier. As a result, supplying only one reference voltage allows output of a plurality of high precision reference currents.

According to a still further feature of the present invention, (N−1) input currents of a first reference current generation circuit which requires N input currents and outputs M output currents, are supplied from (N−1) output currents of a second reference current generation circuit which requires K(M>K) input currents and outputs (N−1) output currents, and K input currents of the second reference current generation circuit are supplied from K output currents, among output currents from the first reference current generation circuit. As a result, externally inputting only one input current allows a current amplification circuit which requires a plurality of current inputs to output a plurality of output currents.

DETAILED DESCRIPTION OF THE PREFERRED EMBODIMENTS

Figure 1:
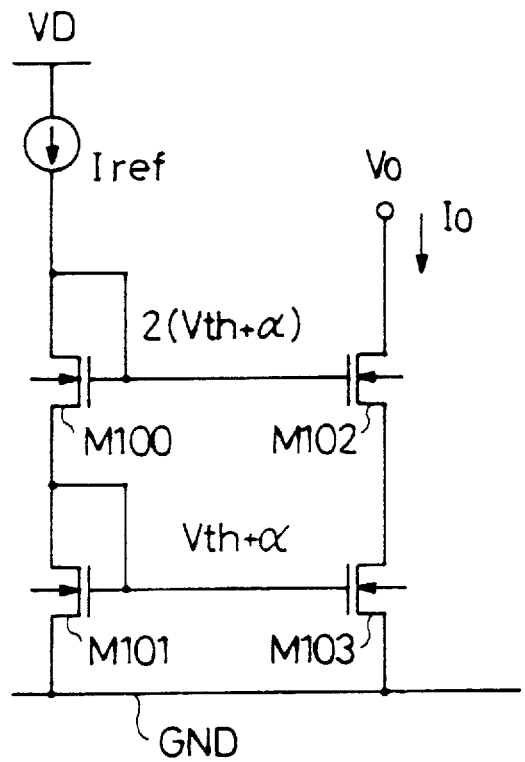
FIG. 1 is a circuit diagram showing a structure of a conventional cascade current mirror circuit.
Figure 2:
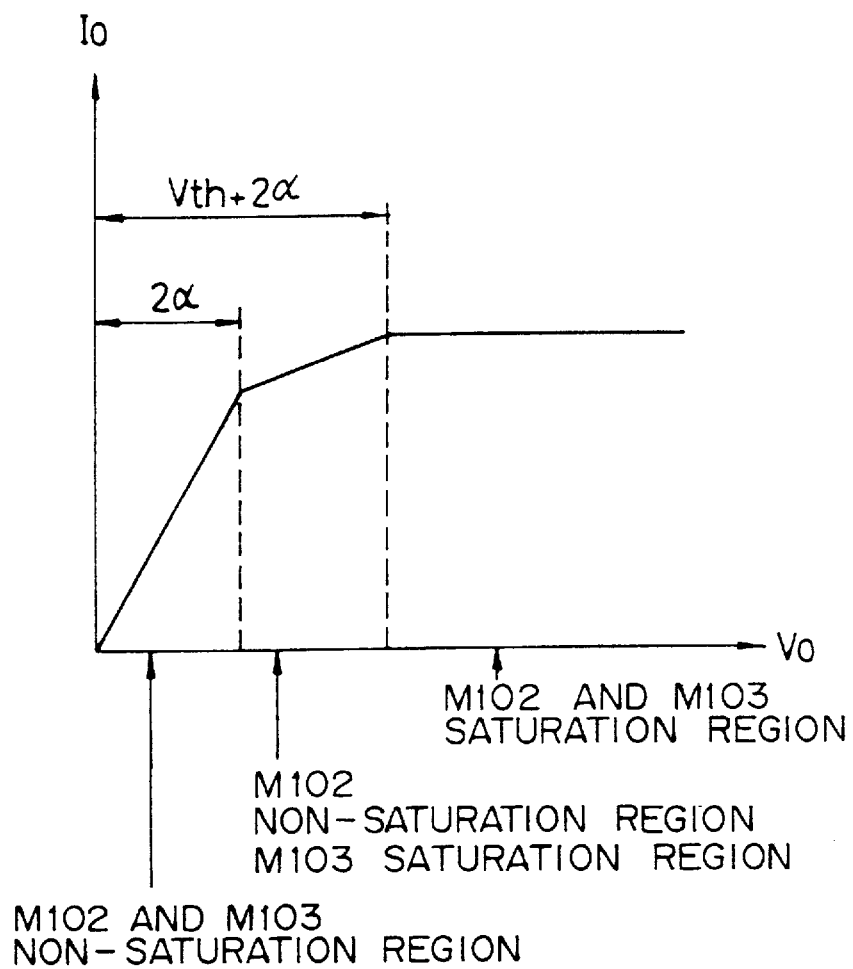
FIG. 2 is shows voltage/current characteristics of the conventional cascade current mirror circuit.

Provided below is an explanation of a current mirror circuit according to the first embodiment of the present invention, by referring to the drawings.

Figure 5:
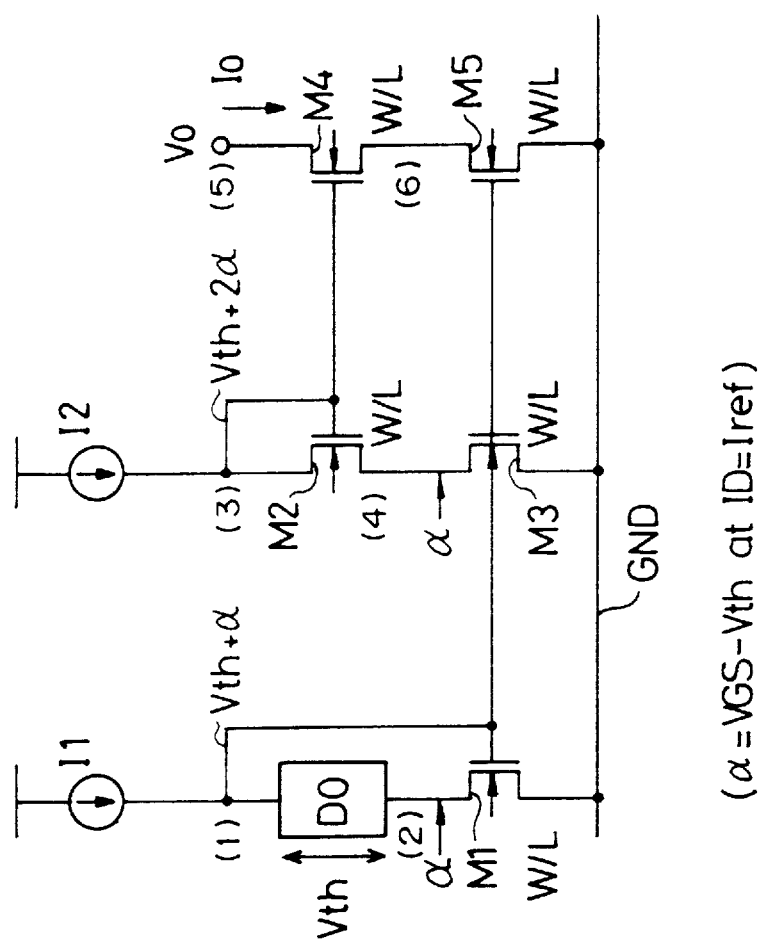
FIG. 5 is a circuit diagram showing a structure of a current mirror circuit according to the first embodiment of the present invention.

FIG. 5 is the circuit diagram showing the structure of the current mirror circuit according to the first embodiment of the present invention.

In this figure, M1 through M5 indicate N-channel MOS transistors. The proportion W/L of gate length to gate width of each of the N-channel MOS transistors M1 through M5 is the same. I1 indicates a first current mirror input current, while I2 indicates a second current mirror input current. The value of the first current mirror input current I1 is equal to that of the current mirror input current I2. D0 indicates a voltage drop device. It is desirable that a value of voltage drop VD0 produced by the voltage drop device D0 is set to a value between "0" and a threshold voltage Vth of the N-channel MOS transistor M1, and especially that the voltage drop VD0 produced by the voltage drop device D0 is set to a value equal to or close to the threshold voltage Vth of the N-channel MOS transistor M1.

A drain terminal of the N-channel MOS transistor M1 is connected to an output side of the first current mirror input current I1 via the voltage drop device D0. A gate terminal of the N-channel MOS transistor M1 is connected to the output side of the first current mirror input current I1, and a source terminal of the N-channel MOS transistor M1 is connected to a ground GND.

Drain and gate terminals of the N-channel MOS transistor M2 are connected to an output side of the second current mirror input current I2.

A drain terminal of the N-channel MOS transistor M3 is connected to a source terminal of the N-channel MOS transistor M2, and a gate terminal of the N-channel MOS transistor M3 is connected to an output side of the first current mirror input current I1. A source terminal of the N-channel MOS transistor M3 is connected to the ground GND.

A drain terminal of the N-channel MOS transistor M4 is connected to an output terminal, and a gate terminal of the N-channel MOS transistor M4 is connected to the output side of the second current mirror input current I2.

A drain terminal of the N-channel MOS transistor M5 is connected to a source terminal of the N-channel MOS transistor M4, and a gate terminal of the N-channel MOS transistor M5 is connected to the output side of the first current mirror input current I1. A source terminal of the N-channel MOS transistor M5 is connected to the ground GND.

That is, by connecting the drain terminal of the N-channel MOS transistor M1 to the output side of the first current mirror input current I1 via the voltage drop device D0, supplying the first current mirror input current I1 to the gate terminals of the N-channel MOS transistors M1, M3, and M5, and supplying the second current mirror input current I2 to the gate terminals of the N-channel MOS transistors M2 and M4, an output current Io is output to the drain of the N-channel MOS transistor M4.

Provided next is an explanation of operations performed by the current mirror circuit according to the first embodiment of the present invention.

This explanation is based on the assumption that the voltage drop VD0 produced by the voltage drop device D0 is equal to the value of the threshold voltage Vth of the N-channel MOS transistor M1.

In FIG. 5, an electric potential of the gate of the N-channel MOS transistor M1 (electric potential at node (1)) is equal to a voltage "VGS1" between the gate and the source of the N-channel MOS transistor M1, that is, Vth+α. Accordingly, the electric potential of the drain (electric potential at node (2)) of the N-channel MOS transistor M1 becomes lower than that of the node (1) by the threshold voltage Vth, and results in a voltage α.

Since the electric potential of the gate of the N-channel MOS transistor M3 is equal to that of the gate of the N-channel MOS transistor M1, the electric potential of the drain of the N-channel MOS transistor M3 (electric potential at node (4)) becomes equal to that of the drain of the N-channel MOS transistor M1, that is, the voltage α.

A voltage "VGS2" between a gate and a source of the N-channel MOS transistor M2 is equal to the voltage "VGS1" between the gate and the source of the N-channel MOS transistor M1, that is, Vth+α. Accordingly, the electric potential of the gate of the N-channel MOS transistor M2 (electric potential at node (3)) is VGS2+α=Vth +2α.

That is, the electric potential of the drain of the N-channel MOS transistor M5 (electric potential at node (6)) is the voltage α, the electric potential of the drain of the N-channel MOS transistor M4 (electric potential at node (5)) is the voltage 2α, and accordingly the minimum value of the output voltage Vo operating in a saturation region is 2α.

Figure 6:
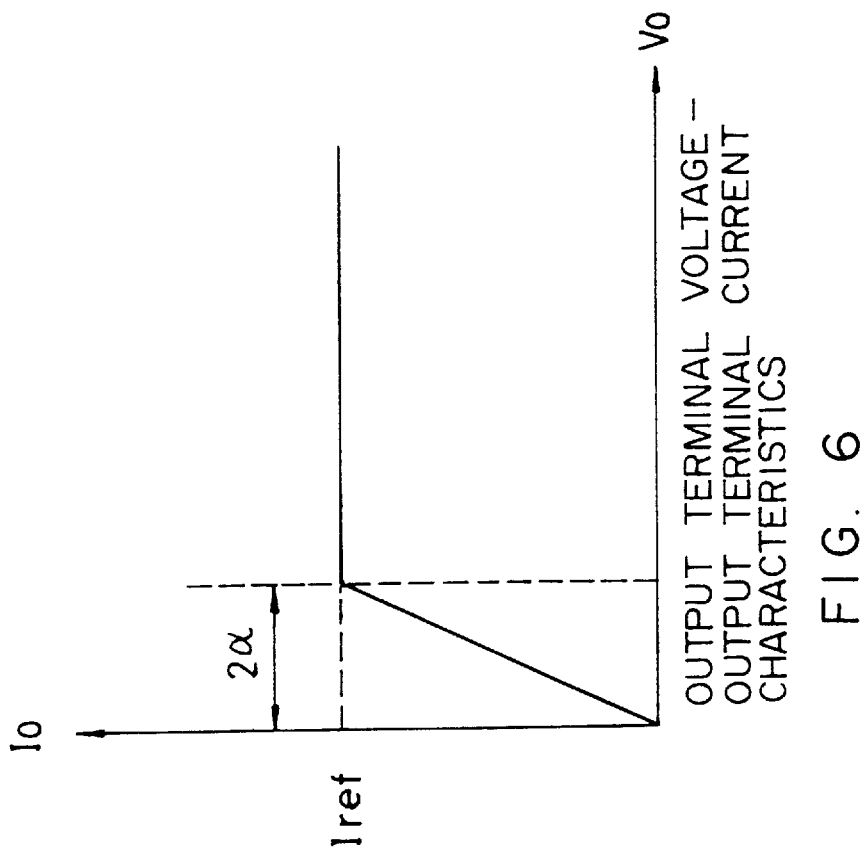
FIG. 6 shows voltage/current characteristics of the current mirror circuit according to the first embodiment of the present invention.

Assume that the values of the first and the second current mirror input currents I1 and I2 are equal to the reference current Iref, and the voltage drop VD0 produced by the voltage drop device D0 is equal to the value of the threshold voltage Vth of the N-channel MOS transistor M1. FIG. 6 shows the relationship between the output voltage Vo and the output current Io in this case. That is, the output voltage Vo is proportional to the output current Io at a voltage equal to or lower than 2α, and becomes almost constant at a voltage equal to or higher than 2α. Therefore, the output current Io equal to the reference current Iref can be obtained on the condition that the output voltage Vo is 2α or higher.

If the value of voltage drop VD0 produced by the voltage drop device D0 is less than that of the threshold voltage Vth of the N-channel MOS transistor M1, the minimum value of the output voltage Vo operating in a saturation region is 2α+Vth−VD0.

If the value of voltage drop VD0 produced by the voltage drop device D0 is larger than that of the threshold voltage Vth of the N-channel MOS transistor M1, the N-channel MOS transistor M1 operates in a non-saturation region. As a result, the precision of the current mirror is degraded.

As described above, with the current mirror circuit according to the first embodiment of the present invention, the electric potential of the gate of the N-channel MOS transistor M4 can be set to Vth+2α, and the minimum value of the output voltage Vo operating in a saturation region can be set to 2α.

Furthermore, the voltage at the output side of the first current mirror input current I1 which requires a higher voltage at an input terminal, is Vth+α, which is lower than that of the cascade current mirror circuit shown in FIG. 1 by the threshold voltage Vth.

A voltage required to provide a current by connecting an output of an N-channel cascade current mirror circuit and an input of a P-channel cascade current mirror circuit, is (Vth+2α)+(2α), thereby lowering the required voltage by 2Vth in comparison with the cascade current mirror shown in FIG. 1.

Additionally, by making the voltage drop VD0 (produced by the voltage drop device D0) equal to or less than the threshold voltage Vth, the current mirror circuit according to the first embodiment of the present invention can operate in a saturation region even if the threshold voltage of the N-channel MOS transistors M2 and M4 is higher than that of the N-channel MOS transistors M3 and M5.

Provided next is an explanation of a current mirror circuit according to the second embodiment of the present invention, by referring to the drawings. The current mirror circuit according to the second embodiment of the present invention is implemented by using an N-channel MOS transistor M0 as the voltage drop device D0 shown in FIG. 5.

Figure 7:
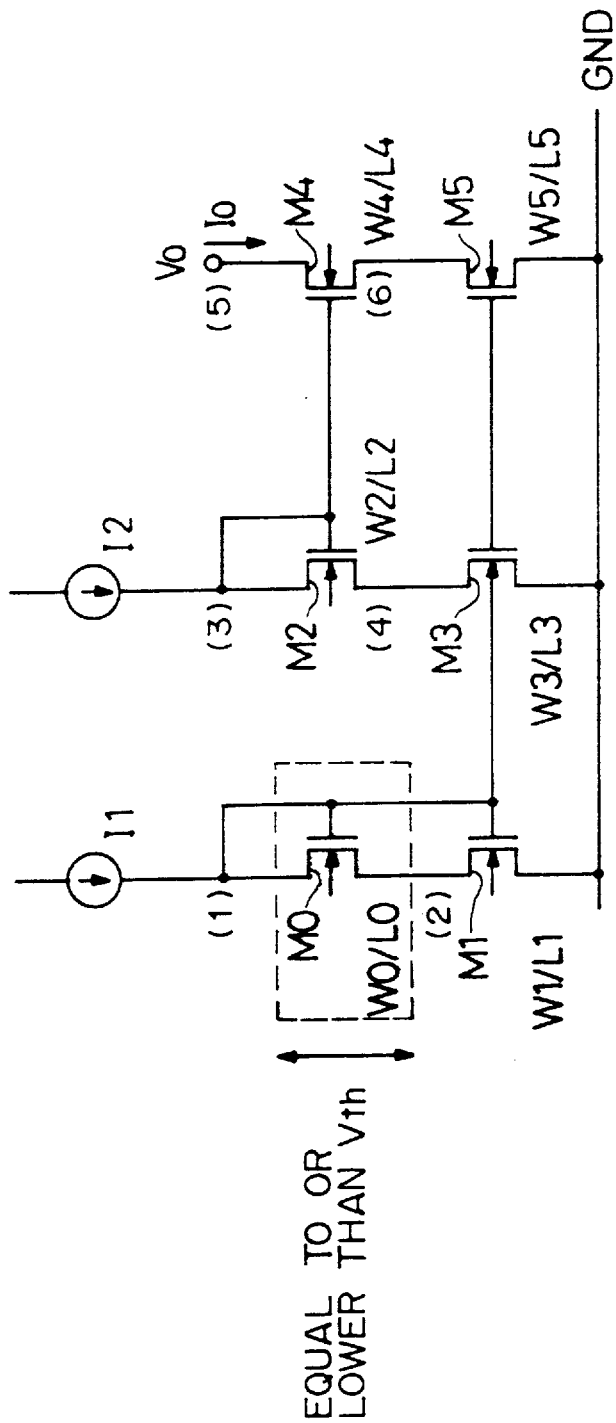
FIG. 7 is a circuit diagram showing a structure of a current mirror circuit according to the second embodiment of the present invention.

FIG. 7 is the circuit diagram showing the structure of the current mirror circuit according to the second embodiment of the present invention.

In this figure, M0 through M5 indicate N-channel MOS transistors. I1 indicates a first current mirror input current, while I2 indicates a second current mirror input current.

Here, a ratio between a value of the first current mirror input current I1 and a proportion "W1/L1" of gate length to gate width of the N-channel MOS transistor M1, is set to be equal to a ratio between a value of the second current mirror input current I2 and a proportion "W3/L3" of gate length to gate width of the N-channel MOS transistor M3.

A ratio between the proportion "W3/L3" of gate length to gate width of the N-channel MOS transistor M3, and a proportion "W5/L5" of gate length to gate width of the MOS transistor M5, is set to be equal to a ratio between a proportion "W2/L2" of gate length to gate width of the N-channel MOS transistor M2 and the proportion "W4/L4" of gate length to gate width of the N-channel MOS transistor M4.

That is, the ratios are set as follows:

$I1:(W1/L1)=I2:(W3/L3)$ $(W3/L3):(W5/L5)=(W2/L2):(W4/L4)$

Then, a proportion "W0/L0" of gate length to gate width of the N-channel MOS transistor M0 is set, so that the voltage VDS0 between a drain and a source of the N-channel MOS transistor M0 is equal to or less than the threshold voltage Vth of the N-channel MOS transistor M1. Especially, it is desirable that the value of the voltage VDS0 between the drain and the source of the N-channel MOS transistor M0 is set to a value equal to or close to the threshold voltage Vth of the N-channel MOS transistor M1.

As a result, the electric potential of the drain (electric potential at node (2)) of the N-channel MOS transistor M1 can be lowered by the value of the voltage VDS0 between the drain and the source of the N-channel MOS transistor M0 while running the N-channel MOS transistors M0 through M5 in a saturation region, thereby outputting a high precision current at a low voltage.

Since the electric potential of the drain of the N-channel MOS transistor M1 is lowered by the value of the voltage VDS0 between the drain and the source of the N-channel MOS transistor M0, the electric potential of the drain of the N-channel MOS transistor M3 (electric potential at node (4)) drops by the value of the voltage VDS0 between the drain and the source of the N-channel MOS transistor M0, and at the same time, the electric potential of the drain of the N-channel MOS transistor M5 (electric potential at node (6)) drops by the value of the voltage VDS0 between the drain and the source of the N-channel MOS transistor M0. Accordingly, the minimum value of the output voltage Vo operating in a saturation region drops by the value of the voltage VDS0 between the drain and the source of the N-channel MOS transistor M0.

Assume that the values of the first and the second current mirror input currents I1 and I2 are equal to the value of the reference current Iref, the voltage VDS0 between the drain and the source of the N-channel MOS transistor M0 is equal to the threshold voltage Vth of the N-channel MOS transistor M1, the gate lengths L1 through L5 of the N-channel MOS transistors M1 through M5 are the same, and the gate widths W1 through W5 of the N-channel MOS transistors M1 through M5 are the same.

In this case, the relationship between the output voltage Vo and the output current Io is like that shown in FIG. 6. The output current Io equal to the reference current Iref can be obtained on the condition that the output voltage Vo is equal to or higher than 2α.

With the current mirror circuit according to the second embodiment of the present invention as described above, by equalizing the value of the voltage VDS0 between the drain and the source of the N-channel MOS transistor M0 to the threshold voltage Vth of the N-channel MOS transistor M1, the electric potential of the gate of the N-channel MOS transistor M4 can be set to Vth+2α, and the minimum value of the output voltage Vo operating in a saturation region can be set to 2α.

Furthermore, a voltage at the output side of the first current mirror input current I1 which requires a higher voltage at an input terminal, results in Vth+α, which is lower than that of the cascade current mirror circuit shown in FIG. 1 by the threshold voltage Vth.

If this embodiment is applied to a CMOS circuit, a voltage required to return a current by connecting an output of an N-channel cascade current mirror circuit and an input of a P-channel cascade current mirror circuit results in (Vth+2α)+(2α), thereby lowering the required voltage by 2Vth in comparison with the cascade current mirror circuit shown in FIG. 1.

In addition, by making the voltage VDS0 between the drain and the source of the N-channel MOS transistor M0 equal to or lower than the threshold voltage Vth of the N-channel MOS transistor M1, the current mirror circuit according to the second embodiment can operate in a saturation region even if the threshold voltage of the N-channel MOS transistors M2 and M4 is higher than that of the N-channel MOS transistors M3 and M5.

To make the voltage VDS0 between the drain and the source of the N-channel MOS transistor M0 equal to or lower than the threshold voltage Vth of the N-channel MOS transistor M1, the proportion "W0/L0" of gate length to gate width of the N-channel MOS transistor M0, for example, is set to be equal to or greater than the proportion "W1/L1" of gate length to gate width of the N-channel MOS transistor M1.

Figure 8:
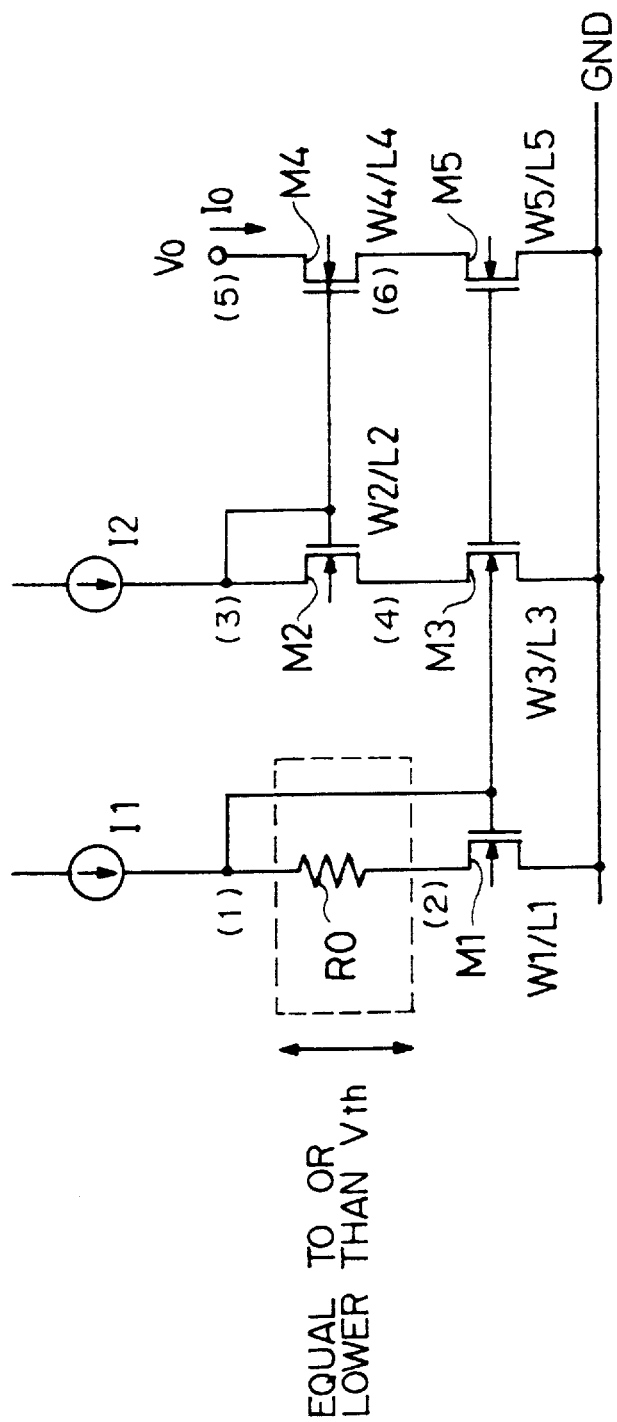
FIG. 8 is a circuit diagram showing a structure of a current mirror circuit according to the third embodiment of the present invention.

Provided next is the explanation about a current mirror circuit according to the third embodiment of the present invention, by referring to the drawings. FIG. 8 is the circuit diagram showing the structure of the current mirror circuit according to the third embodiment of the present invention.

In this figure, M1 through M5 indicate N-channel MOS transistors. I1 indicates a first current mirror input current, while I2 indicates a second current mirror input current. The current mirror circuit according to the third embodiment of the present invention shown in FIG. 8 is implemented by replacing the voltage drop device D0 shown in FIG. 5 with a resistance element R0.

Here, a ratio between a value of the first current mirror input current I1 and a proportion "W1/L1" of gate length to gate width of the N-channel MOS transistor M1 is set to be equal to a ratio between a value of the second current mirror input current I2 and a proportion "W3/L3" of gate length to gate width of the N-channel MOS transistor M3.

Then, a ratio between the proportion "W3/L3" of gate length to gate width of the N-channel MOS transistor M3 and a proportion "W5/L5" of gate length to gate width of the N-channel MOS transistor M5 is set to be equal to a ratio between a proportion "W2/L2" of gate length to gate width of the N-channel MOS transistor M2 and a proportion "W4//L4" of gate length to gate width of the N-channel MOS transistor M4.

A resistance value of the resistance element R0 is set so that a voltage VR0 between terminals of the resistance element R0 is equal to or lower than the threshold voltage Vth of the N-channel MOS transistor M1. Especially, it is desirable that the value of the voltage VR0 between terminals of the resistance element R0 is set to be equal to or close to the threshold voltage Vth of the N-channel MOS transistor M1.

As a result, an electric potential of a drain of the N-channel MOS transistor M1 (electric potential at node (2)) drops by the value of the voltage VR0 between terminals of the resistance element R0.

Since the electric potential of the drain of the N-channel MOS transistor M1 drops by the value of the voltage VR0 between terminals of the resistance element R0, the electric potential of the drain of the N-channel MOS transistor M3 (electric potential at node (4)) drops by the value of the voltage VR0 between terminals of the resistance element R0, and at the same time, the electric potential of the drain of the N-channel MOS transistor M5 (electric potential at node (6)) drops by the value of the voltage VR0 between terminals of the resistance element R0. As a result, the minimum value of the output voltage Vo operating in a saturation region drops by the value of the voltage VR0 between terminals of the resistance element R0.

Assume that the values of the first and the second current mirror input currents I1 and I2 are equal to the reference current Iref, the voltage VR0 between terminals of the resistance element R0 is equal to the threshold voltage Vth of the N-channel MOS transistor M1, gate lengths L1 through L5 of the N-channels MOS transistors M1 through M5 are the same, and gate widths W1 through W5 of the N-channel MOS transistors M1 through M5 are the same.

In this case, the relationship between the output voltage Vo and the output current Io is like that shown in FIG. 6. The output current Io equal to the reference current Iref can be obtained on the condition that the output voltage Vo is equal to or higher than 2α.

With the current mirror circuit according to the third embodiment of the present invention as described above, by equalizing the value of the voltage VR0 between terminals of the resistance element R0 to the value of the threshold voltage Vth of the N-channel MOS transistor M1, the electric potential of the gate of the N-channel MOS transistor M4 results in Vth+2α, and the minimum value of the output voltage operating in a saturation region results in 2α.

Additionally, a voltage at an output side of the first current mirror input current I1 which requires a higher voltage at an input terminal results in Vth+α, which is lower than that of the cascade current mirror circuit shown in FIG. 1 by the value of the threshold voltage Vth.

A voltage required to return a current by connecting an output of an N-channel cascade current mirror circuit and an input of a P-channel cascade current mirror circuit, results in (Vth+2α)+(2α), which is lower than that of the cascade current mirror circuit shown in FIG. 1 by 2Vth.

Furthermore, by making the voltage VR0 between terminals of the resistance element R0 equal to or lower than the threshold voltage Vth of the N-channel MOS transistor M1, the current mirror circuit according to the third embodiment can operate in a saturation region even if the threshold voltage of the N-channel MOS transistors M2 and M4 is higher than that of the N-channel MOS transistors M3 and M5.

Provided next is the explanation about a current mirror circuit according to the fourth embodiment of the present invention, by referring to the drawings.

Figure 9:
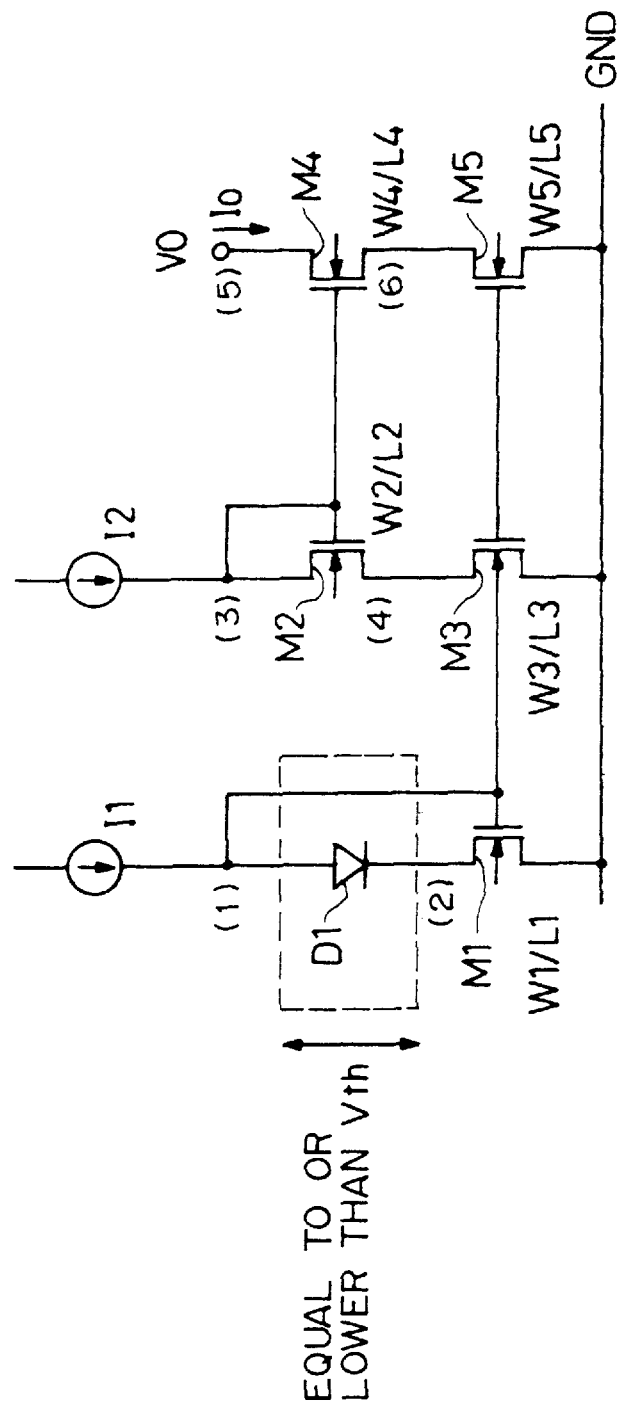
FIG. 9 is a circuit diagram showing a structure of a current mirror circuit according to the fourth embodiment of the present invention.

FIG. 9 is the circuit diagram showing the structure of the current mirror circuit according to the fourth embodiment of the present invention.

In this figure, M1 through M5 indicate N-channel MOS transistors. I1 indicates a first current mirror input current, while I2 indicates a second current mirror input current. The current mirror circuit according to the fourth embodiment of the present invention shown in FIG. 9 is implemented by replacing the voltage drop device D0 shown in FIG. 5 with a diode D1.

A ratio between a value of the first current mirror input current I1 and a proportion "W1/L1" of gate length to gate width of the N-channel MOS transistor M1 is set to be equal to a ratio between a value of the second current mirror input current I2 and a proportion "W3/L3" of gate length to gate width of the N-channel MOS transistor M3.

Then, a ratio between the proportion "W3/L3" of gate length to gate width of the N-channel MOS transistor M3 and a proportion "W5/L5" of gate length to gate width of the N-channel MOS transistor M5 is set to be equal to a ratio between a proportion "W2/L2" of gate length to gate width of the N-channel MOS transistor M2 and a proportion "W4/L4" of gate length to gate width of the N-channel MOS transistor M4.

A type of the diode D1 is selected so that a value of the voltage VD1 between terminals of the diode D1 is equal to or less than the value of the threshold voltage Vth. Especially, it is desirable that the value of the voltage VD1 between terminals of the diode D1 becomes equal to, or close to the value of the threshold voltage Vth.

As a result, an electric potential of the drain of the N-channel MOS transistor M1 (electric potential at node (2)) drops by the value of the voltage VD1 between terminals of the diode D1.

Since the electric potential of the drain of the N-channel MOS transistor M1 drops by the value of the voltage VD1 between terminals of the diode D1, the electric potential of the drain of the N-channel MOS transistor M3 (electric potential at node (4)) drops by the value of the voltage VD1 between terminals of the diode D1, and at the same time, the electric potential of the drain of the N-channel MOS transistor M5 (electric potential at node (6)) drops by the value of the voltage VD1 between terminals of the diode D1. As a result, the minimum value of the output voltage Vo operating in a saturation region drops by the value of the voltage VD1 between terminals of the diode D1.

Assume that the values of the first and the second current mirror input currents I1 and I2 are equal to a value of the reference current Iref, the value of the voltage VD1 between terminals of the Diode D1 is equal to the value of the threshold voltage Vth of the N-channel MOS transistor M1, the gate lengths L1 through L5 of the N-channel MOS transistors M1 through M5 are the same, and the gate widths W1 through W5 of the N-channel MOS transistors M1 through M5 are the same.

In this case, the relationship between the output voltage Vo and the output current Io is like that shown in FIG. 6. The output current Io equal to the reference current Iref can be obtained on the condition the output voltage Vo is equal to or higher than $2\alpha$.

With the current mirror circuit according to the fourth embodiment of the present invention as described above, by equalizing the value of the voltage VD1 between terminals of the diode D1 to a value of the threshold voltage Vth of the N-channel MOS transistor M1, the electric potential of the gate of the N-channel MOS transistor M4 can be set to Vth+$2\alpha$, and the minimum value of the output voltage Vo operating in a saturation region can be set to $2\alpha$.

Additionally, a voltage at an output side of the first current mirror input current I1 which requires higher voltage at an input terminal results in Vth+$\alpha$, which is lower than that of the cascade current mirror circuit shown in FIG. 1 by the threshold voltage Vth.

Furthermore, a voltage required to return a current by connecting an output of an N-channel cascade current mirror and an input of a P-channel cascade current mirror, results in (Vth+$2\alpha$)+($2\alpha$), thereby lowering the required voltage by 2Vth in comparison with the cascade current mirror shown in FIG. 1.

In the meantime, by setting the value of the voltage VD1 between terminals of the diode D1 to a value equal to or less than the threshold voltage Vth of the N-channel MOS transistor M1, the circuit can operate in a saturation region even if the threshold voltage of the N-channel MOS transistors M2 and M4 is higher than that of the N-channel MOS transistors M3 and M5.

Provided next is the explanation about a reference current generation circuit according to the fifth embodiment of the present invention, by referring to the drawing. The reference current generation circuit according to the fifth embodiment of the present invention generates one of two input currents required by a first current mirror circuit in a second current mirror circuit.

Figure 10:
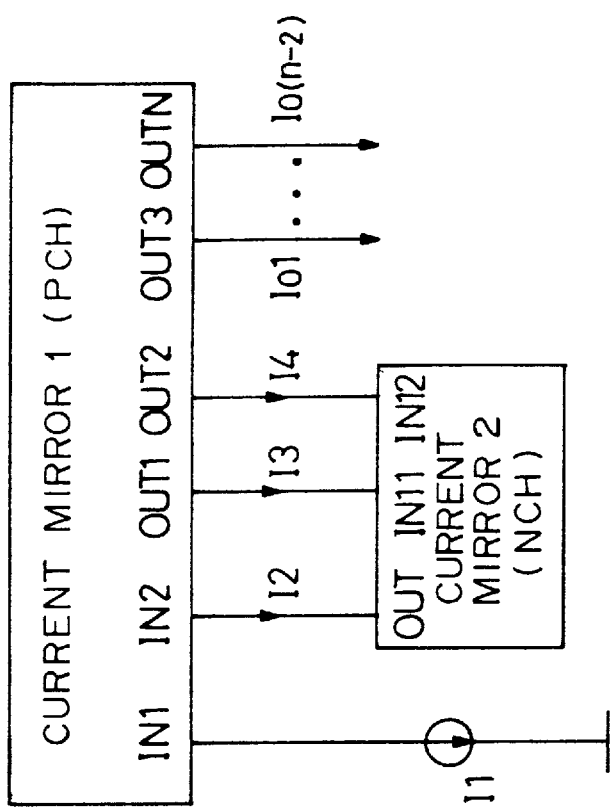
FIG. 10 is a block diagram showing a structure of a reference current generation circuit according to the fifth embodiment of the present invention.

FIG. 10 is a circuit diagram showing a structure of the reference current generation circuit according to the fifth embodiment of the present invention.

In this figure, a current mirror circuit 1 is implemented by a P-channel transistor, and includes two input terminals IN1 and IN2, and "N" output terminals OUT1 through OUTN. A current mirror circuit 2 is implemented by an N-channel transistor, and includes two input terminals IN11 and IN12, and one output terminal OUT.

The input terminal IN2 of the current mirror circuit 1 is connected to the output terminal OUT of the current mirror circuit 2, and the output terminal OUT1 of the current mirror circuit 1 is connected to the input terminal IN11 of the current mirror 2. The output terminal OUT2 of the current mirror circuit 1 is connected to the input terminal IN12 of the current mirror circuit 2.

A current mirror ratio between the input terminal IN2, the output terminal OUT1, and the output terminal OUT2 of the first current mirror circuit 1, is made equal to a ratio between the output terminal OUT, the input terminal IN11, and the input terminal IN12 of the current mirror circuit 2.

Provided next is the explanation about operations performed by the reference current generation circuit according to the fifth embodiment of the present invention.

In FIG. 10, by externally supplying an input current I1 to the input terminal IN1 of the current mirror circuit 1, an input current I2 is supplied from the output terminal OUT of the current mirror circuit 2 to the input terminal IN2 of the current mirror circuit 1, an input current I3 is supplied from the output terminal OUT1 of the current mirror circuit 1 to the input terminal IN11 of the current mirror circuit 2, and an input current I4 is supplied from the output terminal OUT2 of the current mirror circuit 1 to the input terminal IN12 of the current mirror circuit 2.

That is, externally supplying one input current I1 allows the output terminals OUT3 through OUTN of the current mirror circuit 1 to externally output a plurality of output currents Io1 through Io(n−2).

As described above, the reference current generation circuit according to the fifth embodiment of the present invention employs the two-input current mirror circuits 1 and 2, and generates the input current I2 to the current mirror circuit 1 using feedback from the current mirror circuit 2. Two input currents to the current mirror circuit 2 are generated by currents I3 and I4 among the output currents I3, I4, and Io1 through Io(n−2) from the current mirror circuit 1. That is, by externally supplying one input current I1, a plurality of output currents Io1 through Io(n−2) can be output dependent on the precisions of the current mirror circuits 1 and 2.

Especially, if the reference current generation circuit according to the fifth embodiment of the present invention is employed in an IC or an LSI, it will be very effective.

Figure 3:
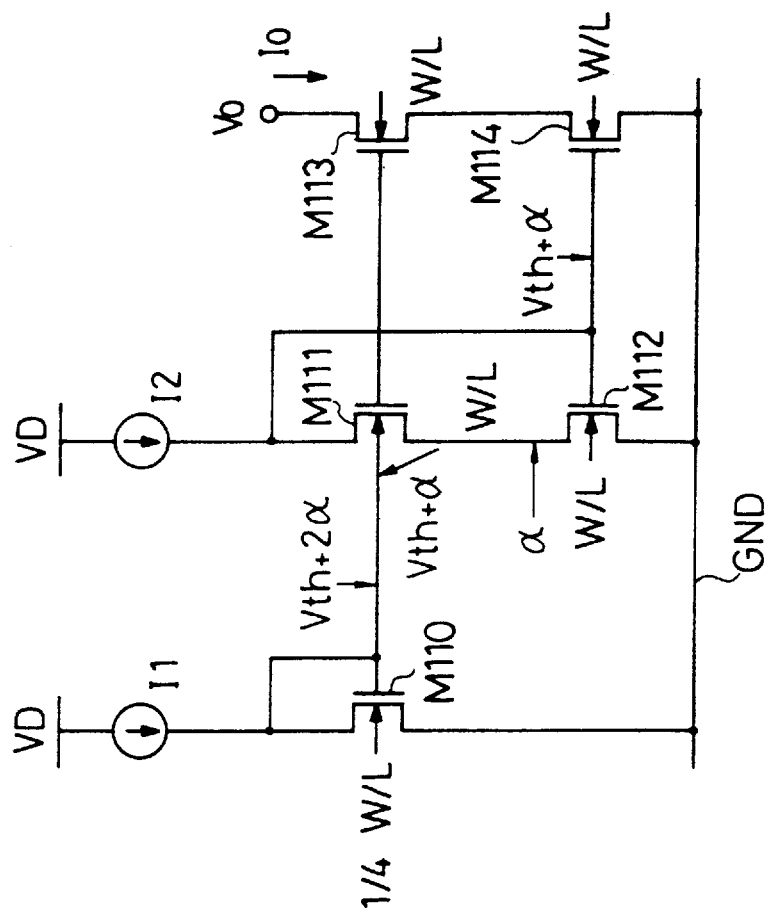
FIG. 3 is a circuit diagram showing a conventional compound current mirror circuit.

Additionally, if this circuit is employed as a power supply for a circuit which requires a plurality of high precision input currents according to a ratio of a size of an input transistor, such as the current mirror circuit shown in FIG. 5, the compound current mirror circuit shown in FIG. 3, etc., the current mirror circuit shown in FIG. 5 and the compound current mirror circuit shown in FIG. 3 can operate with high precision.

Provided next is the explanation about a reference current generation circuit according to the sixth embodiment of the present invention, by referring to the drawings. The reference current generation circuit according to the sixth embodiment of the present invention employs a current amplification circuit shown in FIG. 7 replaced by a P-channel MOS transistor as the current mirror circuit 1 shown in FIG. 10, and also employs the current amplification circuit including an N-channel MOS transistor shown in FIG. 7 as the current mirror circuit 2 shown in FIG. 10.

Figure 11:
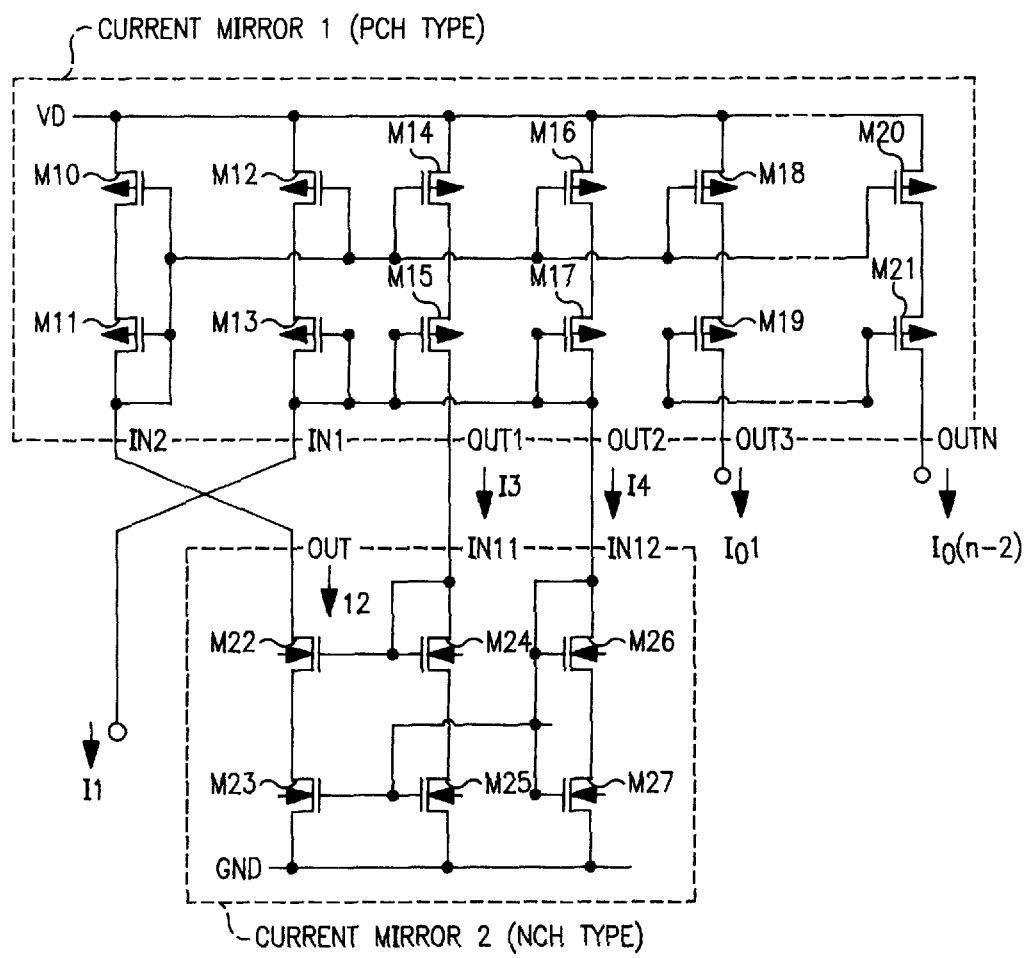
FIG. 11 is a circuit diagram showing a structure of a reference current generation circuit according to the sixth embodiment of the present invention.

FIG. 11 is a circuit diagram showing a reference current generation circuit according to the sixth embodiment of the present invention.

In this figure, a current mirror circuit 1 is composed of P-channel MOS transistors M10 through M21, and includes two input terminals IN1 and IN2, and "N" output terminals OUT1 through OUTN.

Here, the input terminal IN1 is connected to a drain of the P-channel MOS transistor M13, the input terminal IN2 is connected to a drain of the P-channel MOS transistor M11, the output terminal OUT1 is connected to a drain of the P-channel MOS transistor M15, the output terminal OUT2 is connected to a drain of the P-channel MOS transistor M17, the output terminal OUT3 is connected to a drain of the P-channel MOS transistor M19, and the output terminal OUTN is connected to a drain of the P-channel MOS transistor M21.

Source terminals of the P-channel MOS transistors M10, M12, M14, M16, M18, and M20 are connected to an output terminal of a voltage VD, and drain terminals of the P-channel MOS transistors M10, M12, M14, M16, M18, and M20 are respectively connected to source terminals of the P-channel MOS transistors M11, M13, M15, M17, and M19.

A gate terminal of the P-channel MOS transistor M11 is connected to the drain terminal of the P-channel MOS transistor M11, and this transistor M11 serves as a voltage drop device.

Gate terminals of the P-channel MOS transistors M10, M12, M14, M16, M18, and M20 are connected to the input terminal IN2 to configure a current mirror, and gate terminals of the P-channel MOS transistors M13, M15, M17, M19, and M21 are connected to the input terminal IN1 to configure a current mirror.

A current mirror circuit 2 is composed of N-channel MOS transistors M22 through M27, and includes two input terminals IN11 and IN12, and one output terminal OUT.

The input terminal IN11 is connected to a drain of the N-channel MOS transistor M24, the input terminal IN12 is connected to a drain of the N-channel MOS transistor M26, the output terminal OUT is connected to a drain of the N-channel MOS transistor M22.

Source terminals of the N-channel MOS transistors M23, M25, and M27 are connected to a ground GND, while source terminals of the N-channel MOS transistors M22, M24, and M26 are respectively connected to drain terminals of the N-channel MOS transistors M23, M25, and M27.

A gate terminal of the N-channel MOS transistor M26 is connected to the drain terminal of the N-channel MOS transistor M26, and this transistor M26 serves as a voltage drop device.

Gate terminals of the N-channel MOS transistors M22 and M24 are connected to the input terminal IN1 to configure a current mirror, and the gate terminals of the N-channel MOS transistors M23, M25, and M27 are connected to the input terminal IN12 to configure a current mirror.

The input terminal IN2 of the current mirror circuit 1 is connected to the output terminal OUT of the current mirror circuit 2, and the output terminal OUT1 of the current mirror circuit 1 is connected to the input terminal IN11 of the current mirror circuit 2. The output terminal OUT2 of the current mirror circuit 1 is connected to the input terminal IN12 of the current mirror circuit 2.

A current mirror ratio between the input terminal IN2, the output terminal OUT1, and the output terminal OUT2 of the current mirror circuit 1 is equalized to a ratio between the output terminal OUT, the input terminal IN11, and the input terminal IN12 of the current mirror circuit 2.

Provided next is the explanation about operations performed by the reference current generation circuit according to the sixth embodiment of the present invention.

In FIG. 11, by externally supplying an input current I1 to the input terminal IN1 of the current mirror circuit 1, an input current I2 is supplied from the output terminal OUT of the current mirror circuit 2 to the input terminal IN2 of the current mirror circuit 1, an input current I3 is supplied from the output terminal OUT1 of the current mirror circuit 1 to the input terminal IN11 of the current mirror circuit 2, and an input current I4 is supplied from the output terminal OUT2 of the current mirror circuit 1 to the input terminal IN12 of the current mirror circuit 2.

That is, the input current I2 of the two input currents I1 and I2 of the current mirror circuit 1 is supplied from the output terminal OUT of the current mirror circuit 2, and the two input currents I3 and I4 of the current mirror circuit 2 are supplied from the output terminals OUT1 and OUT2 of the current mirror circuit 1.

As a result, externally supplying only one input current I1 allows the two-input current mirror circuits 1 and 2 to operate, and also allows the output terminals OUT3 through OUTN to output a plurality of output currents Io1 through Io(n–2) of the current mirror circuit 1.

The above described embodiment refers to the case where the input current I2 from the current mirror circuit 2 is supplied to the input terminal IN2 of the current mirror circuit 1. However, the input current I2 from the current mirror circuit 2 may be supplied to the input terminal IN1 of the current mirror circuit 1.

Additionally, the above described embodiment refers to the case where the current amplification circuit shown in FIG. 7 is employed as the current mirror circuits 1 and 2. Alternatively, the current amplification circuits shown in FIG. 8 or FIG. 9 may be used.

The compound current mirror circuit shown in FIG. 3 may be also used as the current mirror circuits 1 and 2.

Alternatively, N-channel MOS transistors and P-channel MOS transistors may be used in the current mirror circuits 1 and 2 respectively.

With the reference current generation circuit according to the sixth embodiment of the present invention as described above, two-input current mirror circuits 1 and 2 are used, and the input current I2 to the current mirror circuit 1 is generated by feedback from the current mirror circuit 2. Therefore, externally supplying one input current I1 allows output of a plurality of output currents Io1 through Io(n–2), dependent on the precisions of the current mirror circuits 1 and 2.

Provided next is the explanation about a reference current generation circuit according to the seventh embodiment of the present invention, by referring to the drawings. The reference current generation circuit according to the seventh embodiment of the present invention shows the case where the input current I1 of the reference current generation circuit shown in FIG. 11 is generated by a voltage/current conversion circuit.

Figure 12:
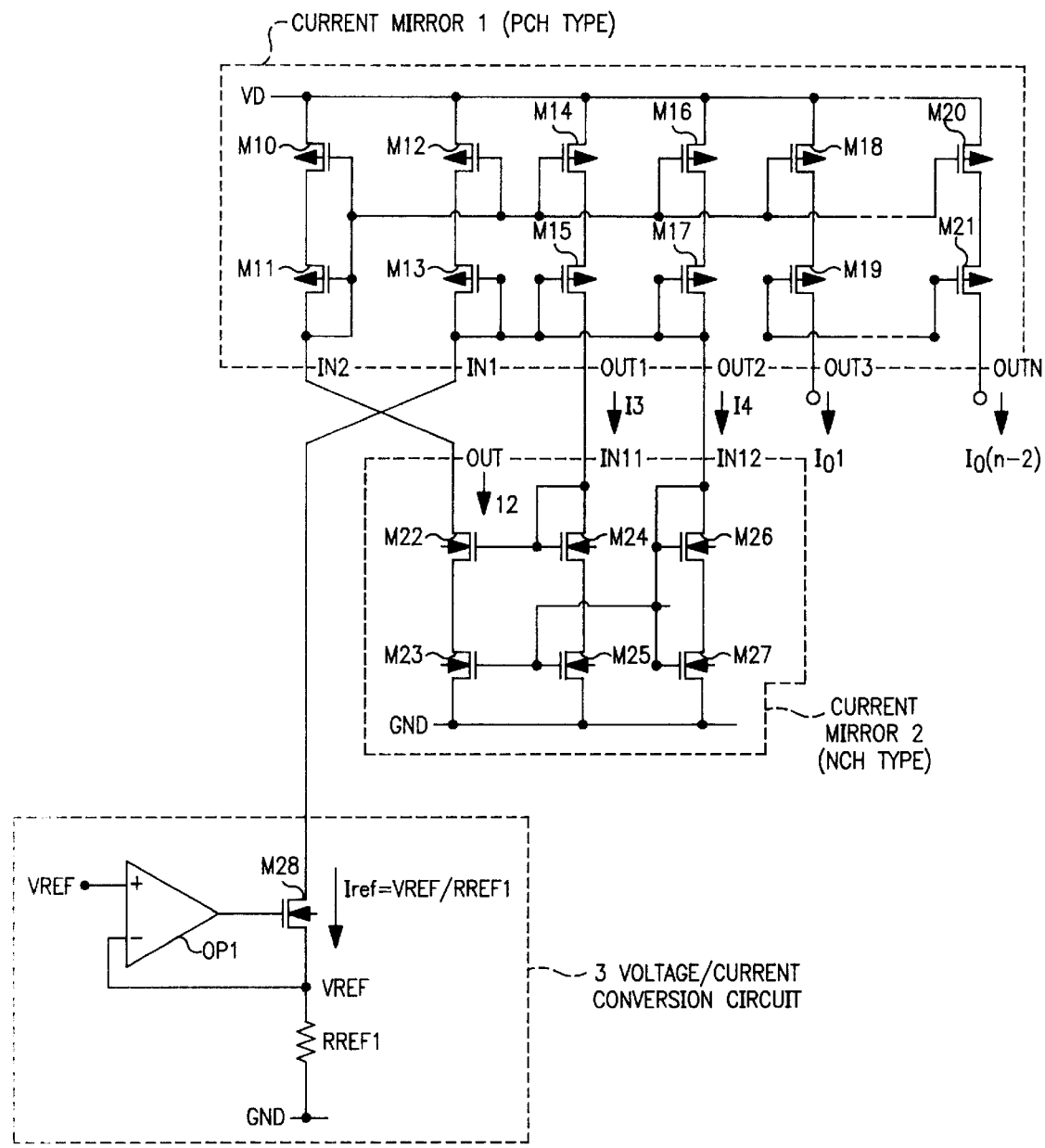
FIG. 12 is a circuit diagram showing a structure of a reference current generation circuit according to the seventh embodiment of the present invention.

FIG. 12 is a circuit diagram showing a structure of the reference current generation circuit according to the seventh embodiment of the present invention.

In this figure, current mirror circuits 1 and 2 are the same as those shown in FIG. 11.

A voltage/current conversion circuit 3 is composed of an operational amplifier OP1, an N-channel MOS transistor M28, and a resistor RREF1. An output terminal of the operational amplifier OP1 is connected to a gate terminal of the N-channel MOS transistor M28. A source terminal of the N-channel MOS transistor M28 is connected to an inverting input terminal of the operational amplifier OP1, and also connected to a ground GND via the resistor RREF1.

A drain terminal of the N-channel MOS transistor M28 is connected to an input terminal IN1 of the current mirror circuit 1.

By inputting a reference voltage VREF to a noninverting input terminal of the operational amplifier OP1, the reference voltage VREF can be supplied to the resistor RREF1, and a reference current Iref=VREF/RREF1 can be generated in a drain of the N-channel MOS transistor M28. As a result, the reference current Iref is supplied to the input terminal IN1 of the current mirror circuit 1.

Provided next is the explanation about operations performed by the reference current generation circuit according to the seventh embodiment of the present invention.

In FIG. 12, the reference current Iref is supplied from the voltage/current conversion circuit 3 to the input terminal IN1 of the current mirror circuit 1, an input current I2 is supplied from the output terminal OUT of the current mirror circuit 2 to the input terminal IN2 of the current mirror circuit 1, an input current I3 is supplied from the output terminal OUT1 of the current mirror circuit 1 to the input terminal IN11 of the current mirror circuit 2, and an input current I4 is supplied from the output terminal OUT2 of the current mirror circuit 1 to the input terminal IN12 of the current mirror circuit 2.

That is, input current I2, which is one of the two input currents I1 and I2 of the current mirror circuit 1, is supplied from the output terminal OUT of the current mirror circuit 2, and two input currents I3 and I4 to the current mirror circuit 2 are supplied from the output terminals OUT1 and OUT2 of the current mirror circuit 1.

As a result, supplying the reference voltage VREF to the voltage/current conversion circuit 3 allows the two-input current mirror circuits 1 and 2 to operate, and also allows output terminals OUTS through OUTN of the current mirror circuit 1 to externally output a plurality of output currents Io1 through Io(n−2).

The above described embodiment refers to the case where the input current I2 from the current mirror circuit 2 is supplied to the input terminal IN2 of the current mirror circuit 1. However, the input current I2 from the current mirror circuit 2 may be supplied to the input terminal IN1 of the current mirror circuit 1.

Figure 4:
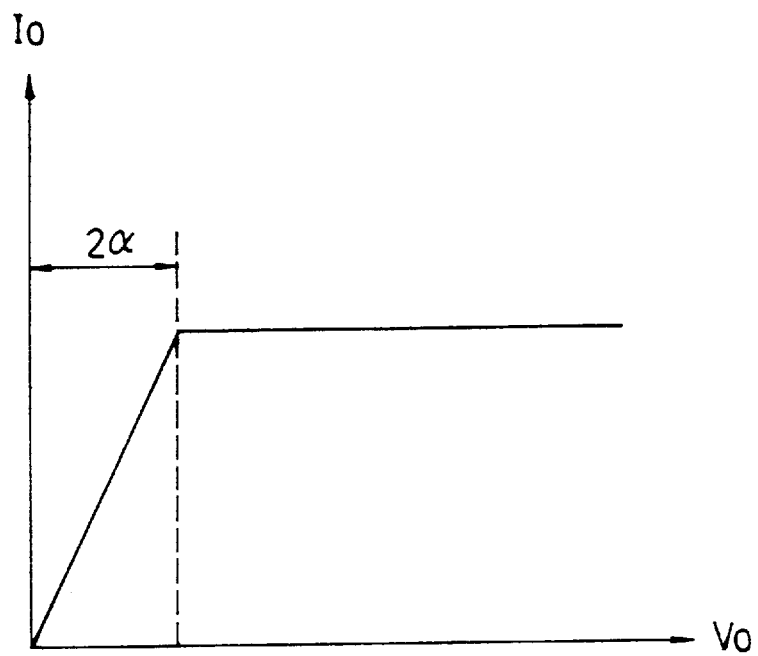
FIG. 4 shows voltage/current characteristics of the conventional compound current mirror circuit.

Additionally, the above described embodiment refers to the case where the current amplification circuit shown in FIG. 7 is employed as the current mirror circuits 1 and 2. Alternatively, the current amplification circuits shown in FIG. 4 or FIG. 5 may be used.

Alternatively, N-channel MOS transistors and P-channel MOS transistors may be used in the current mirror circuits 1 and 2 respectively. In this case, the P-channel MOS transistor replaces the N-channel MOS transistor M28, and a power supply voltage VD replaces the ground GND. With the reference current generation circuit according to the seventh embodiment of the present invention as described above, two-input current mirror circuits 1 and 2 are used, and the input current I2 to the current mirror circuit 1 is generated by feedback from the current mirror circuit 2. In addition, the reference current Iref from the voltage/current conversion circuit 3 is supplied to the input terminal IN1 of the current mirror circuit 1. As a result, supplying only the reference voltage VREF to the voltage/current conversion circuit 3 allows output of a plurality of output currents Io1 through Io(n−2), dependant on the precisions of the current mirror circuits 1 and 2.

Provided next is the explanation about a reference current generation circuit according to the eighth embodiment of the present invention. The reference current generation circuit according to the eighth embodiment of the present invention is a modification implemented by using the compound current mirror circuit shown in FIG. 3 as the current mirror circuits 1 and 2 shown in FIG. 12.

Figure 13:
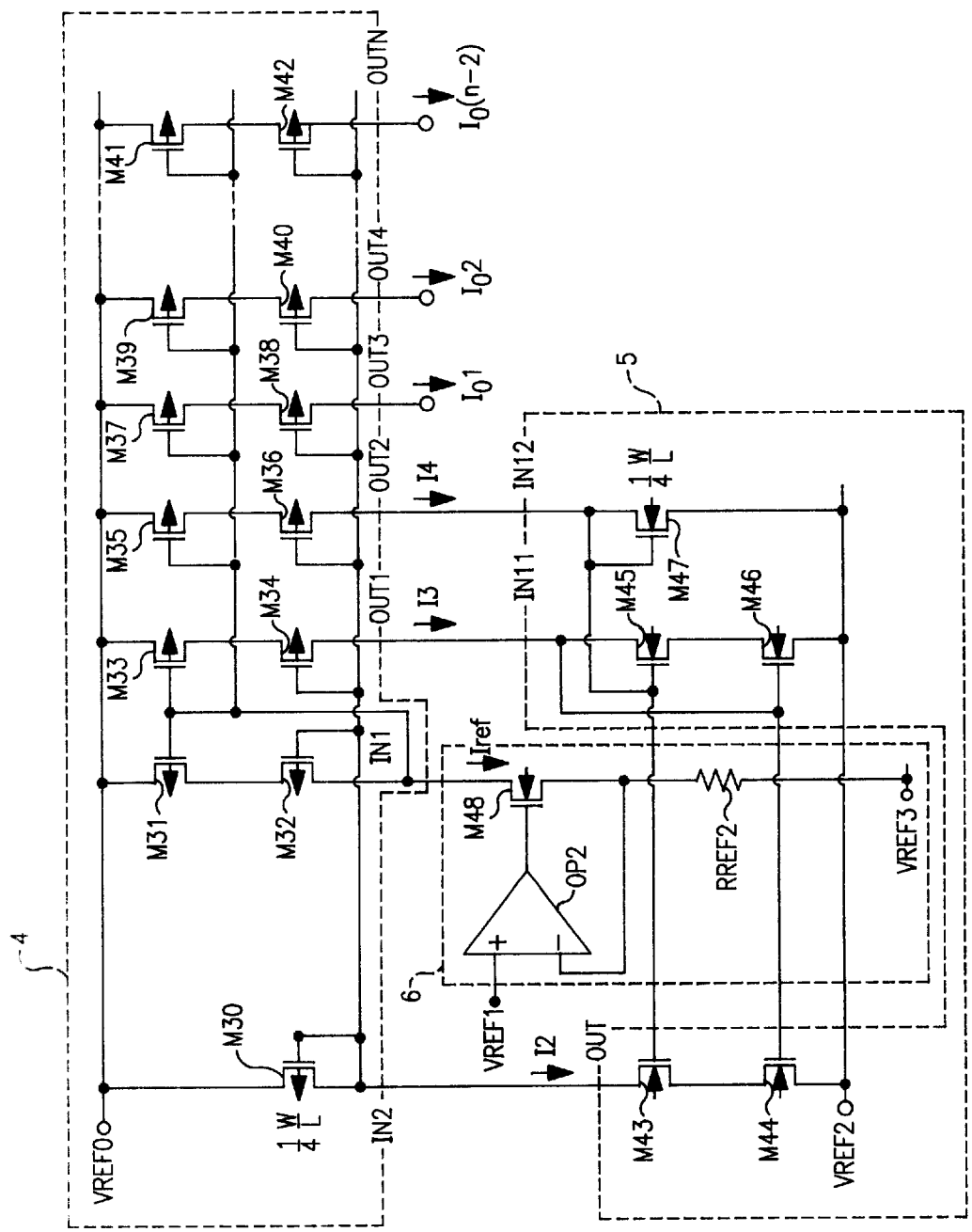
FIG. 13 is a circuit diagram showing a structure of a reference current generation circuit according to the eighth embodiment of the present invention.

FIG. 13 is a circuit diagram showing a structure of the reference current generation circuit according to the eighth embodiment of the present invention.

In FIG. 13, a compound current mirror circuit 4 is composed of P-channel MOS transistors M30 through M42, and includes two input terminals IN1 and IN2, and "N" output terminals OUT1 through OUTN.

The input terminal IN1 is connected to a drain of the P-channel MOS transistor M32, the input terminal IN2 is connected to a drain of the P-channel MOS transistor M30, the output terminal OUT1 is connected to a drain of the P-channel MOS transistor M34, the output terminal OUT2 is connected to a drain of the P-channel MOS transistor M36, the output terminal OUT3 is connected to a drain of the P-channel MOS transistor M38, the output terminal OUT4 is connected to a drain of the P-channel MOS transistor M40, and the output terminal OUTN is connected to a drain of the P-channel MOS transistor M42.

Source terminals of the P-channel MOS transistors M30, M31, M33, M35, M37, M39, and M41 are connected to an output terminal of a voltage VREF0, and drain terminals of the P-channel MOS transistors M31, M33, M35, M37, M39, and M41 are respectively connected to source terminals of the P-channel MOS transistors M32, M34, M36, M38, M40, and M42.

A gate terminal of the P-channel MOS transistor M30 is connected to a drain terminal of the P-channel MOS transistor M30.

Gate terminals of the P-channel MOS transistors M31, M33, M35, M37, M39, and M41 are connected to the input terminal IN1 to configure a current mirror, and gate terminals of the P-channel MOS transistors M32, M34, M36, M38, M40, and M42 are connected to the input terminal IN2 to configure a current mirror.

A compound current mirror circuit 5 is composed of N-channel MOS transistors M43 through M47, and includes two input terminals IN11 and IN12 and one output terminal OUT.

The input terminal IN11 is connected to a drain of the N-channel MOS transistor M45, while the input terminal IN12 is connected to a drain of the N-channel MOS transistor M47. The output terminal OUT is connected to a drain of the N-channel MOS transistor M43.

Source terminals of the N-channel MOS transistors M44, M46, and M47 are connected to an output terminal of a voltage VREF2. Source terminals of the N-channel MOS transistors M43 and M45 are connected to drain terminals of the N-channel MOS transistors M44 and M46 respectively.

A gate terminal of the N-channel MOS transistor M47 is connected to a drain terminal of the N-channel MOS transistor M47.

Gate terminals of the N-channel MOS transistors M44 and M46 are connected to the input terminal IN11 to configure a current mirror, while gate terminals of the N-channel MOS transistors M43, M45, and M47 are connected to the input terminal IN12 to configure a current mirror.

A proportion of gate length to gate width of the P-channel MOS transistor M30 is set to one fourth of a proportion W/L of gate length to gate width of the P-channel MOS transistors M31 through M42. A proportion of gate length to gate width of the N-channel MOS transistor M47 is set to one fourth of a proportion W/L of gate length to gate width of the N-channel MOS transistors M43 through M46.

The input terminal IN1 of the compound current mirror circuit 4 is connected to a drain of the N-channel MOS transistor M48, while the input terminal IN2 of the compound current mirror circuit 4 is connected to the output terminal OUT of the compound current mirror circuit 5. The output terminal OUT1 of the compound current mirror circuit 4 is connected to the input terminal IN11 of the compound current mirror circuit 5, while the output terminal OUT2 of the compound current mirror circuit 4 is connected to the input terminal IN12 of the compound current mirror circuit 5.

A current mirror ratio between the input terminal IN2, the output terminal OUT1, and the output terminal OUT2 of the compound current mirror circuit 4 is set to be a ratio equal to that between the output terminal OUT, the input terminal IN11, and the input terminal IN12 of the compound current mirror circuit 5.

A voltage/current conversion circuit 6 is composed of an operational amplifier OP2, an N-channel MOS transistor M48, and a resistor RREF2. An output terminal of the operational amplifier OP2 is connected to a gate terminal of the N-channel MOS transistor M48. A source terminal of the N-channel MOS transistor M48 is connected to an inverting input terminal of the operational amplifier OP2, and also connected to an output terminal of a voltage VREF3 via the resistor RREF2.

A drain terminal of the N-channel MOS transistor M48 is connected to the input terminal IN1 of the current mirror circuit 4.

As a result, by inputting the reference voltage VREF1 to a non-inverting input terminal of the operational amplifier OP2 and the reference voltage VREF1 to the resistor RREF2, the reference current Iref=VREF1/RREF2 can be generated in the drain of the N-channel MOS transistor M48. As a result, the reference current Iref can be supplied to the input terminal IN1 of the current mirror circuit 4.

Provided next is the explanation about operations performed by the reference current generation circuit according to the eighth embodiment of the present invention.

In FIG. 13, the reference current Iref is supplied from the voltage/current conversion circuit 6 to the input terminal IN1 of the compound current mirror circuit 4, the input current I2 is supplied from the output terminal OUT of the compound current mirror circuit 5 to the input terminal IN2 of the compound current mirror circuit 4, the input current I3 is supplied from the output terminal OUT1 of the compound current mirror circuit 4 to the input terminal IN11 of the compound current mirror circuit 5, and the input current I4 is supplied from the output terminal OUT2 of the compound current mirror circuit 4 to the input terminal IN12 of the compound current mirror circuit 5.

That is, input current I2, which is one of the two input currents I1 and I2 of the compound current mirror circuit 4, is supplied from the output terminal OUT of the compound current mirror circuit 5, and the input currents I3 and I4 are supplied from the output terminals OUT1 and OUT2 of the compound current mirror circuit 4.

As a result, supplying only the reference voltage VREF1 from the voltage/current conversion circuit 6 allows the two-input compound current mirror circuits 4 and 5 to operate, and also allows the output terminals OUT3 through OUTN to output a plurality of output currents Io1 through Io(n–2).

The above described embodiment refers to the case where the input current I2 from the compound current mirror circuit 5 is supplied to the input terminal IN2 of the compound current mirror circuit 4. However, the input current I2 from the compound current mirror circuit 5 may be supplied to the input terminal IN1 of the compound current mirror circuit 4.

Furthermore, N-channel MOS transistors and P-channel MOS transistors may be used in the compound current mirror circuit 4 and 5 respectively. In this case, a P-channel MOS transistor replaces the N-channel transistor M48 and a power supply voltage VD replaces the ground GND.

With the reference current generation circuit according to the eighth embodiment of the present invention as described above, the two-input compound current mirror circuits 4 and 5 are used and the input current I2 of the compound current mirror circuit 4 is generated by feedback from the compound current mirror circuit 5. Additionally, the reference current Iref is supplied from the voltage/current conversion circuit 3 to the input terminal IN1 of the compound current mirror circuit 4. As a result, a plurality of output currents Io1 through Io(n–2) can be output, dependent on the precisions of the compound current mirror circuits 4 and 5.

Provided next is the explanation about a voltage/current conversion circuit according to the ninth embodiment of the present invention, by referring to the drawings. The voltage/current conversion circuit according to the ninth embodiment of the present invention is intended to generate two equal reference currents from one reference voltage.

Figure 14:
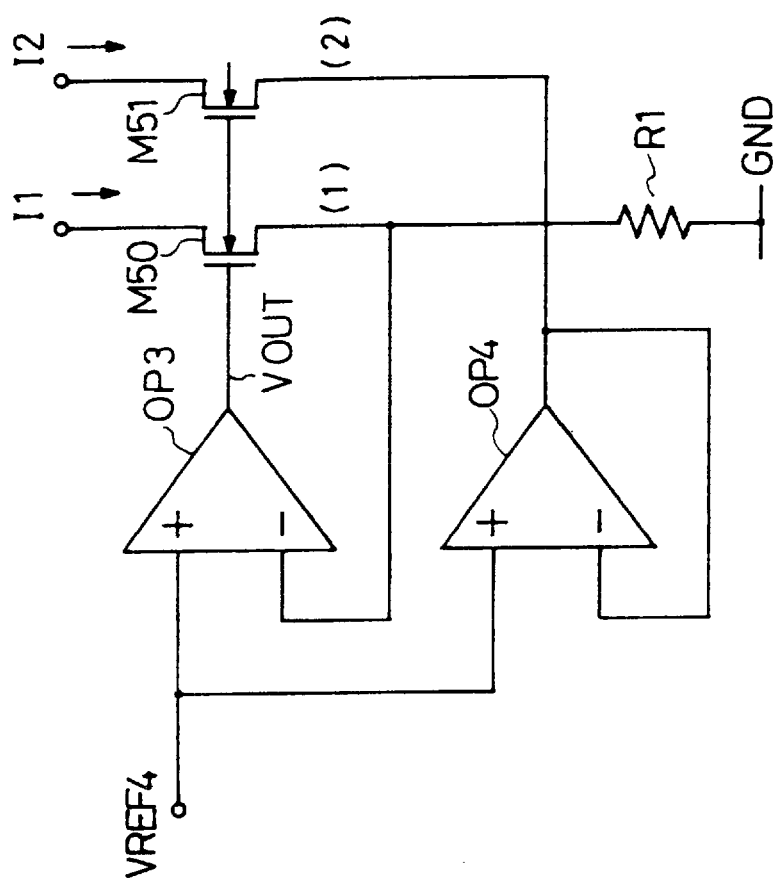
FIG. 14 is a circuit diagram showing a structure of a voltage/current conversion circuit according to the ninth embodiment of the present invention.

FIG. 14 is a circuit diagram showing a structure of the voltage/current conversion circuit according to the ninth embodiment of the present invention.

In this figure, 0P3 and OP4 indicate operational amplifiers, M50 and M51 indicate N-channel MOS transistors, and R1 indicates a resistor.

A drain of the N-channel MOS transistor M50 is connected to a first current output terminal, and a gate of the N-channel MOS transistor M50 is connected to an output terminal of the operational amplifier OP3, and a source of the N-channel MOS transistor M50 is connected to a ground GND via the resistor R1.

A drain of the N-channel MOS transistor M51 is connected to a second current output terminal. A gate of the N-channel MOS transistor M51 is connected to the output terminal of the operational amplifier OP3. A source of the N-channel MOS transistor M51 is connected to an output terminal of the operational amplifier OP4.

A non-inverting input terminal of the operational amplifier OP3 is connected to an output terminal of the reference voltage VREF4, and an inverting input of the operational amplifier OP3 is connected to the source terminal of the N-channel MOS transistor M50.

A non-inverting input of the operational amplifier OP4 is connected to an output terminal of a reference voltage VREF4, while an inverting input of the operational amplifier OP4 is connected to an output terminal of the operational amplifier OP4.

That is, a first reference current I1 is generated by a first reference current generation circuit including the operational amplifier OP3, the N-channel MOS transistor M50, and the resistor R1, while a second reference current I2 is generated by a second reference current generation circuit including the operational amplifier OP4 and the N-channel MOS transistor M51, which are configured as a voltage follower.

Provided next is the explanation about operations performed by the voltage/current conversion circuit according to the ninth embodiment of the present invention.

In FIG. 14, if a gain of the operational amplifier OP3 is infinite, electric potentials of non-inverting and inverting inputs of the operational amplifier OP3 become equal. If the reference voltage VREF4 is supplied to the non-inverting input of the operational amplifier OP3, an electrical potential of the source of the N-channel MOS transistor M50 (electric potential at node (1)) becomes equal to the reference voltage VREF4. Even if the gain of the operational amplifier OP3 is not infinite but large, the error range is small.

Accordingly, the first reference current I1 according to a value of the VREF4/R1 is applied to the drain of the N-channel MOS transistor M50.

Additionally, since the operational amplifier OP4 is a voltage follower, electric potentials of a non-inverting input and an output of the operational amplifier OP4 become equal. As a result, the electric potential of the source of the N-channel MOS transistor M51 (electric potential at node (2)) becomes equal to the reference voltage VREF4.

If a size of the N-channel MOS transistor M50 is equal to that of the N-channel MOS transistor M51, a voltage between a gate and a source of the N-channel MOS transistor M50 and M51 is a value obtained by subtracting the reference voltage VREF4 from an output voltage VOUT of the operational amplifier OP3.

Accordingly, to the drain of the N-channel MOS transistor M51, a current becomes the same as that applied to the drain of the N-channel MOS transistor M50, and the value of the first and the second reference currents I1 and I2 become equal.

By making the size of the N-channel MOS transistor M50 different from that of the N-channel MOS transistor M51, the first and the second reference currents I1 and I2 can be also obtained as being dependent on a ratio of the size of the N-channel MOS transistor M50 to the size of the N-channel MOS transistor M51.

With the voltage/current conversion circuit according to the ninth embodiment of the present invention as described above, a plurality of reference currents I1 and I2 can be obtained from the reference voltage VREF4.

If electric potentials of output terminals are equalized, precision can be improved in comparison with a plurality of reference currents generated by a normal current mirror. P-channel MOS transistors may replace the N-channel MOS transistors M50 and M51. It is not significant if the ground GND has a different electric potential.

Provided next is the explanation about a voltage/current conversion circuit according to the tenth embodiment of the present invention, by referring to the drawings. The voltage/current conversion circuit according to the tenth embodiment of the present invention is intended to generate a plurality of reference currents by supplying two reference currents generated by the voltage/current conversion circuit shown in FIG. 14, to the current mirror circuit shown in FIG. 7.

Figure 15:
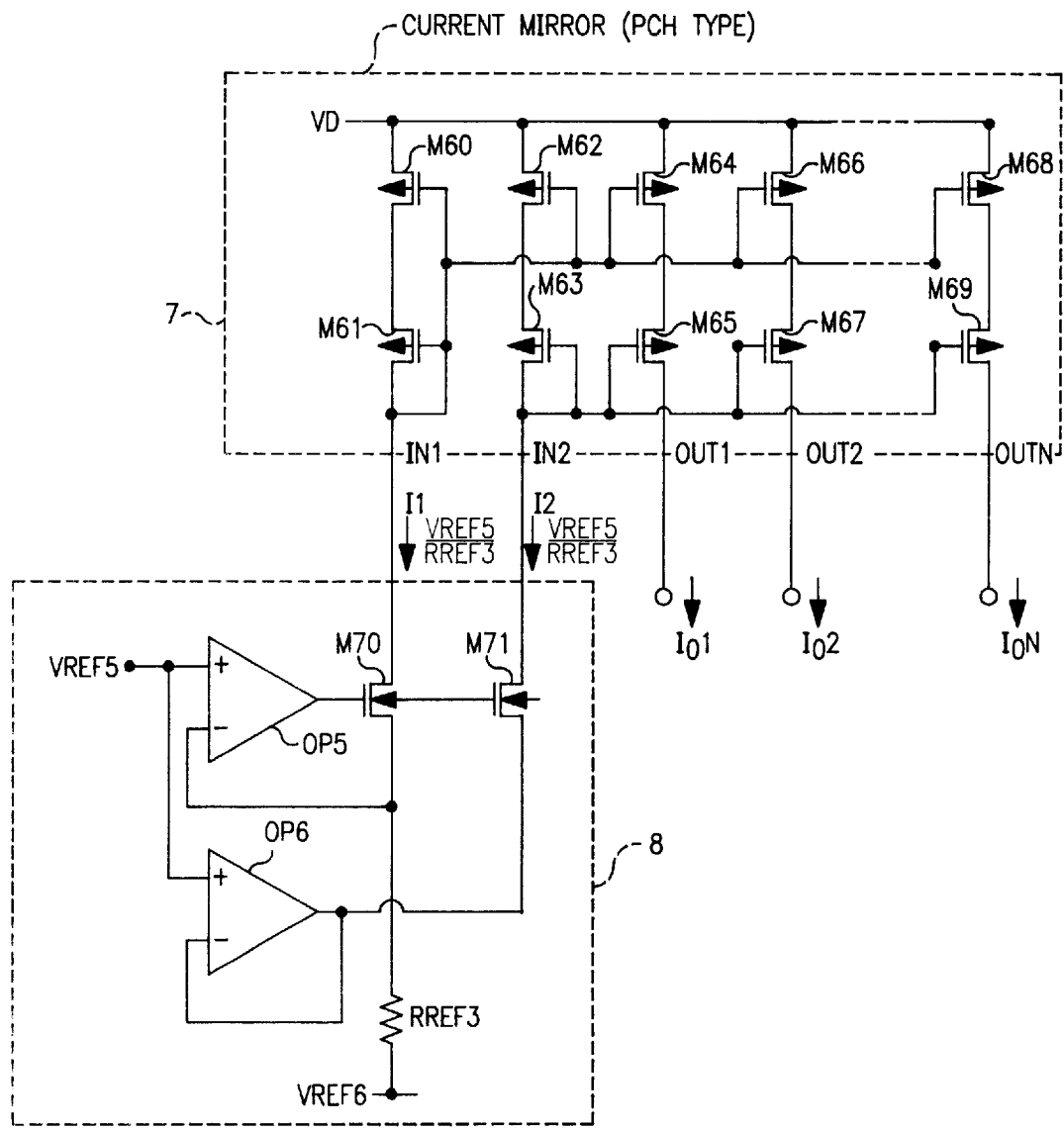
FIG. 15 is a circuit diagram showing a structure of a voltage/current conversion circuit according to the tenth embodiment of the present invention.

FIG. 15 is a circuit diagram showing a structure of the voltage/current conversion circuit according to the tenth embodiment of the present invention.

In this figure, a current mirror circuit 7 is composed of P-channel MOS transistors M60 through M69, and includes two input terminals IN1 and IN2, and "N" output terminals OUT1 through OUTN.

The input terminal IN1 is connected to a drain of the P-channel MOS transistor M61, the input terminal IN2 is connected to a drain of the P-channel MOS transistor M63, the output terminal OUT1 is connected to a drain of the P-channel MOS transistor M65, the output terminal OUT2 is connected to a drain of the P-channel MOS transistor M67, and the output terminal OUTN is connected to a drain of the P-channel MOS transistor M69.

Source terminals of the P-channel MOS transistors M60, M62, M64, M66, and M68 are connected to an output terminal of a voltage VD. Drain terminals of the P-channel MOS transistors M60, M62, M64, M66, and M68 are connected to source terminals of the P-channel MOS transistors M61, M63, M65, M67, and M69 respectively.

A gate germinal of the P-channel MOS transistor M61 is connected to a drain terminal of the P-channel MOS transistor M61, and this transistor M61 serves as a voltage drop device.

Gate terminals of the P-channel MOS transistors M60, M62, M64, M66, and M68 are connected to the input terminal IN1 to configure a current mirror, and gate terminals of the P-channel MOS transistors M63, M65, M67, and M69 are connected to the input terminal IN2 to configure a current mirror.

A voltage/current conversion circuit 8 is composed of operational amplifiers OP5 and OP6, N-channel MOS transistors M70 and M71, and a resistor RREF3.

A source of the N-channel MOS transistor M70 is connected to an output terminal of a voltage VREF6 via a resistor RREF3, and a gate of the N-channel MOS transistor M70 is connected to an output terminal of the operational amplifier OP5 to which a reference voltage VREF5 is input as a non-inverting input, and to which a source voltage of the N-channel MOS transistor M70 is input as an inverting input.

A source of the N-channel MOS transistor M71 is connected to an output terminal of the operational amplifier OP6 configuring a voltage follower, and a gate of the N-channel MOS transistor 71 is connected to an output terminal of the operational amplifier OP5.

The input terminal IN1 of a current mirror circuit 7 is connected to a drain of the N-channel MOS transistor M70, while the input terminal IN2 of the current mirror circuit 7 is connected to a drain of the N-channel MOS transistor M71.

Provided next is the explanation about operations performed by the voltage/current conversion circuit according to the tenth embodiment of the present invention.

In FIG. 15, by supplying a reference voltage VREF5 to a non-inverting input of the operational amplifier OP5, a first reference current I1=VREF5/RREF3 is applied to the drain of the N-channel MOS transistor M70, while a second reference current I2=VREF5/RREF3 is applied to the drain of the N-channel MOS transistor M71. Then, the first reference current I1 is supplied to the input terminal IN1 of the current mirror circuit 7, while the second reference current I2 is supplied to the input terminal IN2 of the current mirror circuit 7.

The current mirror circuit 7 to which the first and the second reference currents I1 and I2 are supplied, outputs a plurality of reference currents Io1 through IoN from output terminals OUT1 through OUTN by performing a current mirror operation.

The above described embodiment refers to the case where the input current I1 from the voltage/current conversion circuit 8 is supplied to the input terminal IN1 of the current mirror circuit 7, and the input current I2 from the voltage/ current conversion circuit 8 is supplied to the input terminal IN2 of the current mirror circuit 7. However, the input currents I1 and I2 from the voltage/current conversion circuit 8 may be supplied to the input terminals IN2 and IN1 of the current mirror circuit 7 respectively.

The above described embodiment also refers to the example where the current amplification circuit shown in FIG. 3 is used as the current mirror circuit 7, is given. However, the current amplification circuit shown in FIG. 8 or FIG. 9 may be used.

Alternatively, N-channel MOS transistors may be used as the current mirror circuit 7. In this case, P-channel MOS transistors replace the N-channel MOS transistors M70 and M71.

With the voltage/current conversion circuit according to the tenth embodiment of the present invention as described above, the first and the second reference currents I1 and I2 generated from one reference voltage VREF5 are used as two input currents to the current mirror circuit 7, thereby obtaining a plurality of high precision reference currents Io1 through IoN.

Provided next is the explanation about a voltage/current conversion circuit according to the eleventh embodiment of the present invention, by referring to the drawings. The voltage/current conversion circuit according to the eleventh embodiment of the present invention is intended to generate a plurality of reference currents by supplying two reference currents generated by the voltage/current conversion circuit shown in FIG. 14 to the compound current mirror circuit shown in FIG. 3.

Figure 16:
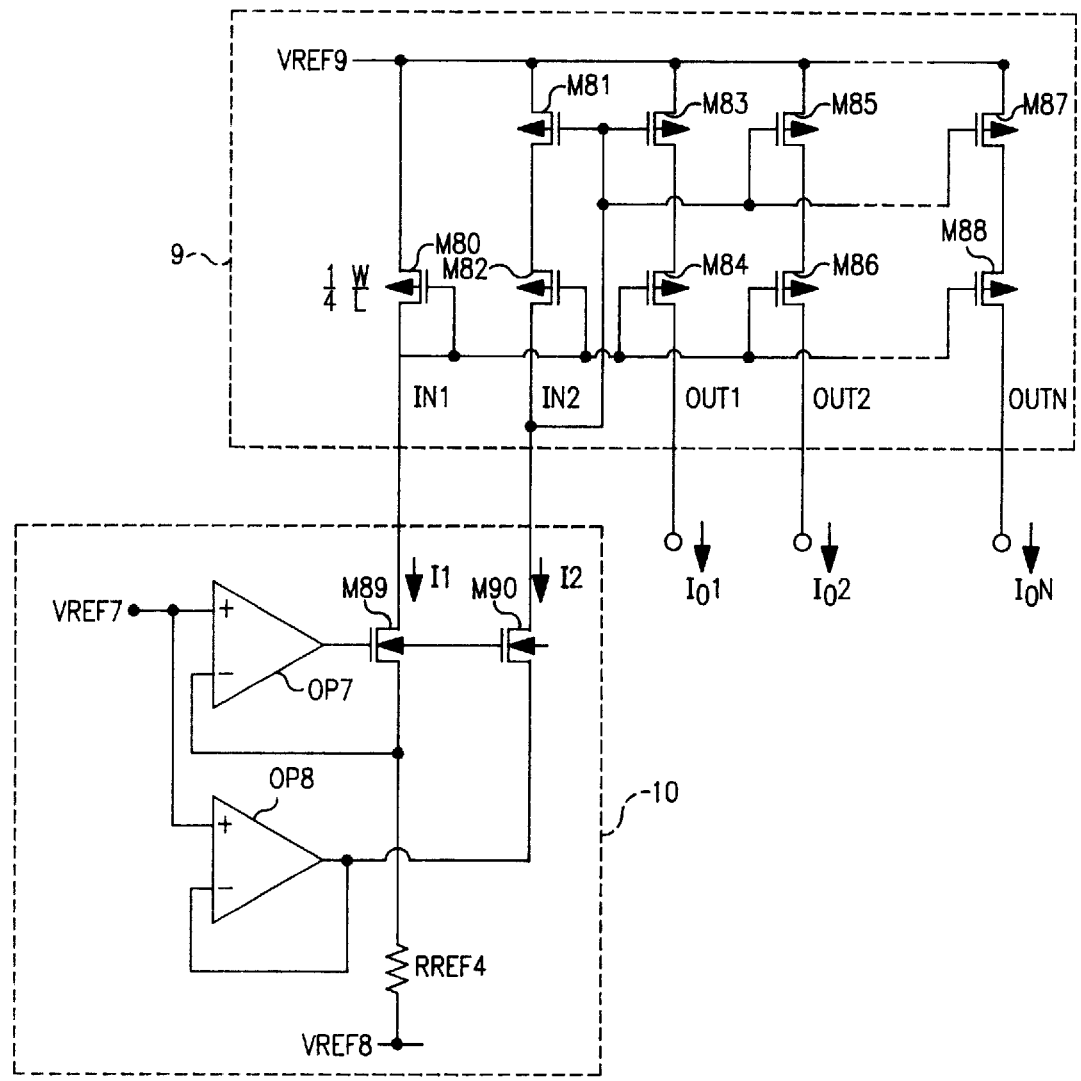
FIG. 16 is a circuit diagram showing a structure of a voltage/current conversion circuit according to the eleventh embodiment of the present invention.

FIG. 16 is a circuit diagram showing a structure of a voltage/current conversion circuit according to the eleventh embodiment of the present invention.

In this figure, a compound current mirror circuit 9 is composed of P-channel MOS transistors M80 through M88, and includes two input terminals IN1 and IN2, and "N" output terminals OUT1 through OUTN. A proportion of gate length to gate width of the P-channel MOS transistor M80 is one fourth of a proportion "W/L" of gate length to gate width of the P-channel MOS transistors M81 through M88.

The input terminal IN1 is connected to a drain of the P-channel MOS transistor M80, while the input terminal IN2 is connected to a drain of the P-channel MOS transistor M82. The output terminal OUT1 is connected to a drain of the P-channel MOS transistor M84, while the output terminal OUT2 is connected to a drain of the P-channel MOS transistor M86. The output terminal OUTN is connected to a drain of the P-channel MOS transistor M88.

Source terminals of the P-channel MOS transistors M80, M81, M83, M85, and M87 are connected to an output terminal of a voltage VREF9. Drain terminals of the P-channel MOS transistors M81, M83, M85, M87 are connected to source terminals of the P-channel MOS transistors M82, M84, M86, and M88 respectively.

A gate terminal of the P-channel MOS transistor M80 is connected to a drain terminal of the P-channel MOS transistor M80.

Gate terminals of the P-channel MOS transistors M80, M82, M84, M86, and M88 are connected to the input terminal IN1 to configure a current mirror, while gate terminals of the P-channel MOS transistors M81, M83, M85, and M87 are connected to the input terminal IN2 to configure a current mirror.

A voltage/current conversion circuit 10 is composed of operational amplifiers OP7 and OP8, N-channel MOS transistors M89 and M90, and a resistor RREF4.

A source of the N-channel MOS transistor M89 is connected to an output terminal of a voltage VREF8 via a resistor RREF4, and a gate of the N-channel MOS transistor M89 is connected to an output terminal of the operational amplifier OP7 to which a reference voltage VREF7 is input as a non-inverting input, and to which a source voltage of the N-channel MOS transistor M89 is input as an inverting input.

A source of the N-channel MOS transistor M90 is connected to an output terminal of the operational amplifier OP8 configuring a voltage follower, and a gate of the N-channel MOS transistor M90 is connected to an output terminal of the operational amplifier OP7.

The input terminal IN1 of the compound current mirror circuit 9 is connected to a drain of the N-channel MOS transistor M89. The input terminal IN2 of the compound current mirror circuit 9 is connected to a drain of the N-channel MOS transistor M90.

Provided next is the explanation about operations performed by a voltage/current conversion circuit according to the eleventh embodiment of the present invention.

In FIG. 16, by supplying the reference voltage VREF7 to the non-inverting input of the operational amplifier OP7, the first reference current I1=VREF7/RREF4 is applied to the drain of the N-channel MOS transistor M89, and the second reference current I2=VREF7/RREF4 is applied to the drain of the N-channel MOS transistor M90. Then, the first reference current I1 is supplied to the input terminal IN1 of the compound current mirror circuit 9, and the second reference current I2 is supplied to the input terminal IN2 of the compound current mirror circuit 9.

The compound current mirror circuit 9 to which the first and the second reference currents I1 and I2 are supplied outputs a plurality of reference currents Io1 through IoN from output terminals OUT1 through OUTN.

The above described embodiment refers to the case where the input current I1 from the voltage/current conversion circuit 10 is supplied to the input terminal IN1 of the current mirror circuit 9, and the input current I2 from the voltage/current conversion circuit 10 is supplied to the input terminal IN2 of the current mirror circuit 9. However, the input current I1 from the voltage/current conversion circuit 10 may be supplied to the input terminal IN2 of the current mirror circuit 9, and the input current I2 from the voltage/current conversion circuit 10 may be supplied to the input terminal IN1 of the current mirror circuit 9.

Alternatively, N-channel MOS transistors may be used in the current mirror circuit 9. In this case, P-channel MOS transistors replace the N-channel MOS transistors M89 and M90.

With the voltage/current conversion circuit according to the eleventh embodiment as described above, the first and the second reference currents I1 and I2 generated from one reference voltage VREF7 are used as two input currents to the compound current mirror circuit 9, thereby obtaining the plurality of high precision reference currents Io1 through IoN.

The above described embodiment of the present invention is not limited to this case. Field-effect transistors or bipolar transistors, for example, may replace the MOS transistors.

As described above, with reference to FIG. 5, since the drain of the first input transistor is connected to the first current input terminal via the voltage drop device, the electric potential of the drain of the second output transistor can be lowered by a voltage drop produced by the voltage drop device, thereby lowering an output voltage.

Furthermore, since the voltage drop produced by the voltage drop device is set to a value equal to or less than a threshold voltage of the first input transistor, an output voltage can be lowered by a voltage drop produced by the voltage drop device while leaving a precision of the output current unchanged.

In addition, adjusting a proportion of gate length to gate width of a transistor allows each transistor to operate in a saturation region, thereby obtaining a high precision output current.

In the meantime, a voltage drop can be set arbitrarily. Since a diode may be used as the voltage drop device as shown in FIG. 9, a voltage drop can be set with high precision.

Furthermore, as shown in FIG. 10, one of current inputs to the first current amplification circuit which requires two current inputs may be generated by using a second current amplification circuit, and a current input to the second current amplification circuit may be generated by using the first current amplification circuit. As a result, externally supplying only one input current allows a current amplification circuit which requires two current inputs, to output a plurality of output currents.

Additionally, a current amplification circuit comprising: a first input transistor whose drain is connected to a first current input terminal via a voltage drop device, whose gate is connected to the first current input terminal, and whose source is connected to a common terminal; a second input transistor whose drain and gate are connected to a second current input terminal; a third input transistor whose drain is connected to a source of the second input transistor, whose gate is connected to the first current input terminal, and whose source is connected to the common terminal; a first output transistor whose drain is connected to an output terminal, and whose gate is connected to the second current input terminal; and a second output transistor whose drain is connected to the source of the first output transistor, whose gate is connected to the first current input terminal, and whose source is connected to the common terminal, is used as the first and the second current amplification circuits. Therefore, externally supplying only one input current allows a current amplification circuit which requires two current inputs to output a plurality of high precision output currents at a low output voltage.

Furthermore, since a compound current mirror circuit may be used as the first and the second current amplification circuits, externally supplying only one input current allows a current amplification circuit which requires two current inputs to output a plurality of high precision output currents at a low output voltage.

In the meantime, an output current from a voltage/current conversion circuit to which a reference voltage is input, is used as an input current to the first current input terminal included in a current amplification circuit as recited above, or to a compound current mirror circuit. Therefore, externally supplying only one reference voltage allows a current amplification circuit which requires two current inputs to externally output a plurality of high precision output currents at a low output voltage.

In addition, a P-channel field-effect transistor may be used in the first current amplification circuit, and an N-channel field-effect transistor is used in the second current amplification circuit. As a result, externally supplying only one input current allows a current amplification circuit which requires two current inputs to output a plurality of output currents at a low output voltage.

On the contrary, by using an N-channel field-effect transistor in the first current amplification circuit, and a P-channel field-effect transistor in the second current amplification circuit, externally supplying only one input current allows a current amplification circuit which requires two current inputs to output a plurality of output currents at a low output voltage.

In the meantime, by inputting a result of comparison between a voltage of a source and a reference voltage to a gate of a first transistor, inputting the reference voltage to a source of a second transistor via a voltage follower, and inputting the result of the comparison to the gate of the second transistor, supplying only one reference voltage allows output of a plurality of high precision reference currents.

Furthermore, by supplying the first reference current generated by inputting the result of the comparison between the voltage of the source of the first transistor and the reference voltage, to the first current input terminal of the current amplification circuit as recited above, inputting the reference voltage to the source of the second transistor via a voltage follower, and supplying the second reference current generated by inputting the result of the comparison to the gate of the second transistor, to the second current input terminal of the current amplification circuit as recited above, supplying only one reference voltage allows output of a plurality of high precision reference currents at a low voltage.

In addition, by supplying the first reference current generated by inputting the result of the comparison between the voltage of the source of the first transistor and the reference voltage, to the first current input terminal of the compound current mirror circuit, inputting the reference voltage to the source of the second transistor via a voltage follower, and supplying the second reference current generated by inputting the result of the comparison to the gate of the second transistor, to the second current input terminal of the compound current mirror circuit supplying only one reference voltage allows output of a plurality of high precision reference currents.

Furthermore, by connecting the source of the first transistor to a voltage input terminal via a resistance element, connecting its gate to an output terminal of the first operational amplifier to which a reference voltage is input as a non-inverting input and a voltage of the source is input as an inverting input, connecting a source of the second transistor to an output terminal of the second operational amplifier to which the reference voltage is input as a non-inverting input and an output voltage is input as an inverting input, and connecting its gate to the output terminal of the first operational amplifier, supplying only one reference voltage allows output of a plurality of high precision reference currents.

In addition, by supplying (N−1) input currents of the first reference current generation circuit which requires "N" input currents, from (N−1) output currents of the second reference current generation circuit which requires K(M>K) input currents, and supplying K input currents to the second reference current generation circuit from K output currents of the first reference current generation circuit, externally supplying only one input current allows a current amplification circuit which requires a plurality of input currents to output a plurality of output currents.

What is claimed is:
1. A current amplification circuit, comprising:
   a first input transistor whose drain is connected to a first current input terminal via a voltage drop means, whose gate is connected to the first current input terminal, and whose source is connected to a common terminal of the current amplification circuit;
   a second input transistor whose drain and gate are connected to a second current input terminal;

a third input transistor whose drain is connected to a source of the second input transistor, whose gate is connected to the first current input terminal, and whose source is connected to the common terminal;

a first output transistor whose drain is connected to an output terminal of the current amplification circuit, and whose gate is connected to the second current input terminal; and a second output transistor whose drain is connected to a source of the first output transistor, whose gate is connected to the first current input terminal, and whose source is connected to the common terminal.

2. The current amplification circuit as set forth in claim 1, wherein a voltage drop produced by the voltage drop means is set to a value equal to or less than that of a threshold voltage of the first input transistor.

3. The current amplification circuit as set forth in claim 1, wherein a ratio between a current value from the first current input terminal and a proportion of gate length to gate width of the first input transistor is set to equal a ratio between a current value from the second current input terminal and a proportion of gate length to gate width of the third input transistor; and a ratio between the proportion of gate length to gate width of the third input transistor and a proportion of gate length to gate width of the second output transistor is set to equal a ratio between a proportion of gate length to gate width of the second input transistor and a proportion of gate length to gate width of the first output transistor.

4. The current amplification circuit as set forth in claim 1, wherein the voltage drop means is a transistor whose drain and gate are connected to the first current input terminal, and whose source is connected to the drain of the first input transistor.

5. The current amplification circuit as set forth in claim 1, wherein the voltage drop means is a resistance element.

6. The current amplification circuit as set forth in claim 1, wherein the voltage drop means is a diode.

7. The current amplification circuit as set forth in claim 1, wherein:

a first reference current, generated by inputting a result of a comparison between an electric potential of a source of a first transistor and a reference voltage to a gate of the first transistor, is supplied to the first current input terminal; and a second reference current, generated by inputting the reference voltage to a source of a second transistor via a voltage follower, and inputting the result of the comparison to a gate of the second transistor, is supplied to the second current input terminal.

8. A current amplification circuit, comprising:

a transistor whose gate terminal is connected to an output side of a first input current, and whose drain terminal is connected to the output side of the first input current via a voltage drop device;

a current mirror circuit of a first stage to which the first input current is input as a current mirror; and a current mirror circuit of a second stage connected to the current mirror circuit of the first stage in tandem, to which a second input current is input as the current mirror.

9. A reference current generation circuit, comprising:

a first current amplification circuit having first and second current input terminals and first, second, and third current output terminals; and a second current amplification circuit having first and second current input terminals and at least one current output terminal, wherein the first current input terminal of the first current amplification circuit connects to an external current input terminal;

the current output terminal of the second current amplification circuit is connected to the second current input terminal of the first current amplification circuit;

the first current input terminal of the second current amplification circuit is connected to the first current output terminal of the first current amplification circuit;

the second current input terminal of the second current amplification circuit is connected to the second current output terminal of the first current amplification circuit;

the third current output terminal of the first current amplification circuit connects to an external current output terminal; and one of the first current amplification circuit and the second current amplification circuit including:

a first input transistor whose gate terminal is connected to an output side of a first input current and whose drain terminal is connected to an output side of the first input current via a voltage drop device;

a current mirror circuit of a first stage which uses the first input current as a current mirror input; and a current mirror circuit of a second stage, which is connected to the current mirror circuit of the first stage in tandem and uses a second input current as a current mirror input.

10. The reference current generation circuit as set forth in claim 9, wherein:

the first current amplification circuit includes a P-channel field-effect transistor; and the second current amplification circuit includes an N-channel field-effect transistor.

11. The reference current generation circuit as set forth in claim 9, wherein a source terminal of said first input transistor is connected to a common terminal; and at least one of the current mirror circuits of the first stage and the second stage further comprises:

a second input transistor whose drain and gate are connected to the second current input terminal;

a third input transistor whose drain is connected to a source of the second input transistor, whose gate is connected to the first current input terminal, and whose source is connected to the common terminal;

a first output transistor whose drain is connected to a current output terminal, and whose gate is connected to the second current input terminal; and a second output transistor whose drain is connected to a source of the first output transistor, whose gate is connected to the first current input terminal, and whose source is connected to the common terminal.

12. The reference current generation circuit as set forth in claim 11, wherein the first current input terminal of the first current amplification circuit receives an output current from a voltage/current conversion circuit as an input current, a reference voltage being input to the voltage/current conversion circuit.

13. The reference current generation circuit as set forth in claim 9, wherein
at least one of the first and the second current amplification circuits is a compound current mirror circuit.

14. The reference current generation circuit as set forth in claim 9, wherein:
the first current amplification circuit includes an N-channel field-effect transistor; and
the second current amplification circuit includes a P-channel field-effect transistor.

15. The reference generation circuit as set forth in claim 9, wherein:
said first current amplification circuit further has a number of current output terminals in addition to the first, second, and third current output terminals thereof; and
each of the number of additional current output terminals of said first current amplification circuit connects to an external current output terminal.

16. A reference current generation circuit, comprising:
a first reference current generation circuit for generating a first reference current by inputting a result of a comparison between a source potential of a first transistor and a reference voltage, to a gate of the first transistor; and
a second reference current generation circuit for generating a second reference current by inputting the reference voltage to a source of a second transistor via a voltage follower, and inputting the result of the comparison to a gate of the second transistor.

17. A current amplification circuit, comprising:
means for supplying a first reference current, generated by inputting a result of a comparison between an electric potential of a source of a first transistor and a reference voltage to a gate of the first transistor, to a first current input terminal of a compound current mirror circuit; and
means for supplying a second reference current, generated by inputting the reference voltage to a source of a second transistor via a voltage follower, and inputting the result of the comparison to a gate of the second transistor, to a second current input terminal of the compound current mirror circuit.

18. A voltage/current conversion circuit, comprising:
a first transistor whose source is connected to a voltage input terminal via a resistance element, and whose gate is connected to an output terminal of a first operational amplifier to which a reference voltage is input as a non-inverting input and a voltage of the source of the first transistor is input as an inverting input; and
a second transistor whose source is connected to an output terminal of a second operational amplifier to which the reference voltage is input as a noninverting input, and an output voltage is input as an inverting input, and whose gate is connected to the output terminal of the first operational amplifier.

19. A reference current generation method receiving a plurality of input currents as current mirror inputs, comprising the steps of:
inputting a first current, as a current mirror input of a first current mirror circuit, to a gate terminal of a transistor and, via a voltage drop device, to a drain terminal of the transistor;
extracting a plurality of current mirror outputs from the first current mirror circuit;
inputting one of the plurality of current mirror outputs of the first current mirror circuit as a current mirror input to a second current mirror circuit; and
using a current mirror output of the second current mirror circuit as the first current.

20. A reference current generation circuit, comprising:
a first current amplification circuit having first and second current input terminals and first, second, and third high-precision current output terminals; and
a second current amplification circuit having first and second current input terminals and at least one high-precision current output terminal, wherein:
the first current input terminal of the first current amplification circuit connects to an external current input terminal;
the high-precision current output terminal of the second current amplification circuit is connected to the second current input terminal of the first current amplification circuit;
the first current input terminal of the second current amplification circuit is connected to the first high-precision current output terminal of the first current amplification circuit;
the second current input terminal of the second current amplification circuit is connected to the second high-precision current output terminal of the first current amplification circuit; and
the third high-precision current output terminal of the first current amplification circuit connects to an external current output terminal.

21. The reference generation circuit as set forth in claim 20, wherein:
said first current amplification circuit further has a number of high-precision current output terminals in addition to the first, second, and third high-precision current output terminals thereof; and
each of the number of additional high-precision current output terminals of said first current amplification circuit connects to an external current output terminal.

22. A reference current generation circuit, comprising:
a first current amplification circuit having a plurality of current input terminals and a plurality of current output terminals; and
a second current amplification circuit having a plurality of current input terminals, and at least one current output terminal, wherein
an external current input is connected to a first current input terminal of the first current amplification circuit;
a current output terminal of the second current amplification circuit is connected to a second current input terminal of the first current amplification circuit;
a first current input terminal of the second current amplification circuit is connected to a first current output terminal of the first current amplification circuit;
a second current input terminal of the second current amplification circuit is connected to a second current output terminal of the first current amplification circuit; and
an external current output terminal is connected to a third current output terminal of the first current amplification circuit; and
wherein at least one of the first and the second current amplification circuits comprises:

a first input transistor whose drain is connected to the first current input terminal via a voltage drop means, whose gate is connected to the first current input terminal, and whose source is connected to a common terminal;

a second input transistor whose drain and gate are connected to the second current input terminal;

a third input transistor whose drain is connected to a source of the second input transistor, whose gate is connected to the first current input terminal, and whose source is connected to the common terminal;

a first output transistor whose drain is connected to an output terminal, and whose gate is connected to the second current input terminal; and a second output transistor whose drain is connected to a source of the first output transistor, whose gate is connected to the first current input terminal, and whose source is connected to the common terminal.

23. The reference generation circuit as set forth in claim 22, wherein the first current input terminal of said first current amplification circuit receives an output current of a voltage/current conversion circuit as an input current, a reference voltage being input to the voltage/current conversion circuit.

24. A reference current generation circuit, comprising:

a first current amplification circuit having first and second current input terminals and first, second, and third current output terminals; and a second current amplification circuit having first and second current input terminals and at least one current output terminal;

a transistor whose gate terminal is connected to an output side of a first input current of a first one of said current amplification circuits and whose drain terminal is connected to an output side of the first input current via a voltage drop device;

a current mirror circuit of a first stage which uses the first input current as a current mirror input; and a current mirror circuit of a second stage, which is connected to the current mirror circuit of the first stage in tandem and uses a second input current of a second one of said current amplification circuits as a current mirror input;

and wherein the first current input terminal of the first current amplification circuit connects to an external current input terminal;

the current output terminal of the second current amplification circuit is connected to the second current input terminal of the first current amplification circuit;

the first current input terminal of the second current amplification circuit is connected to the first current output terminal of the first current amplification circuit;

the second current input terminal of the second current amplification circuit is connected to the second current output terminal of the first current amplification circuit; and the third current output terminal of the first current amplification circuit connects to an external current output terminal.

* * * * *

UNITED STATES PATENT AND TRADEMARK OFFICE
CERTIFICATE OF CORRECTION

PATENT NO. : 5,892,402
DATED : April 6, 1999
INVENTOR(S) : Tsubaki et al.

It is certified that error appears in the above-indentified patent and that said Letters Patent is hereby corrected as shown below:

Col. 3, line 50, "a" should be --α--.

Col. 29, line 57, "noninverting" should be ---non-inverting--.

-- 9. A reference current generation circuit, comprising:
a first current amplification circuit having first and second current input terminals and first, second, and third current output terminals; and Signed and Sealed this Second Day of November, 1999

Attest:

Q. TODD DICKINSON

*Attesting Officer*   *Acting Commissioner of Patents and Trademarks*

UNITED STATES PATENT AND TRADEMARK OFFICE
CERTIFICATE OF CORRECTION

PATENT NO. : 5,892,402
DATED : April 6, 1999
INVENTOR(S) : Tsubaki et al.

It is certified that error appears in the above-indentified patent and that said Letters Patent is hereby corrected as shown below:

a second current amplification circuit having first and second current input terminals and at least one current output terminal, wherein
 the first current input terminal of the first current amplification circuit connects to an external current input terminal;
 the current output terminal of the second current amplification circuit is connected to the second current input terminal of the first current amplification circuit;
 the first current input terminal of the second current amplification circuit is connected to the first current output terminal of the first current amplification circuit;
 the second current input terminal of the second current amplification circuit is connected to the second current output terminal of the first current amplification circuit;
 the third current output terminal of the first current amplification circuit connects to an external current output terminal; and
 one of the first current amplification circuit and the second current amplification circuit including:
 a first input transistor whose gate terminal is connected to an output side of a first input current and whose drain terminal is connected to an output side of the first input current via a voltage drop device;
 a current mirror circuit of a first stage which uses the first input current as a current mirror input; and
 a current mirror circuit of a second stage, which is connected to the current mirror circuit of the first stage in tandem and uses a second input current as a current mirror input.--